United States Patent
Kim et al.

(10) Patent No.: US 10,985,275 B2
(45) Date of Patent: Apr. 20, 2021

(54) SEMICONDUCTOR DEVICE

(71) Applicant: Samsung Electronics Co., Ltd., Suwon-si (KR)

(72) Inventors: Weonhong Kim, Suwon-si (KR); Wandon Kim, Seongnam-si (KR); Hyeonjun Baek, Hwaseong-si (KR); Sangjin Hyun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/503,790

(22) Filed: Jul. 5, 2019

(65) Prior Publication Data
US 2020/0013899 A1 Jan. 9, 2020

(30) Foreign Application Priority Data

Jul. 6, 2018 (KR) .................. 10-2018-0078866
Jan. 15, 2019 (KR) .................. 10-2019-0005360

(51) Int. Cl.
*H01L 29/78* (2006.01)
*H01L 21/28* (2006.01)
*H01L 29/06* (2006.01)
*H01L 29/423* (2006.01)
*H01L 29/49* (2006.01)
*H01L 29/51* (2006.01)
*H01L 29/66* (2006.01)
*H01L 29/786* (2006.01)

(52) U.S. Cl.
CPC .. *H01L 29/78391* (2014.09); *H01L 21/28088* (2013.01); *H01L 29/0673* (2013.01); *H01L 29/40111* (2019.08); *H01L 29/42392* (2013.01); *H01L 29/4908* (2013.01); *H01L 29/4966* (2013.01); *H01L 29/516* (2013.01); *H01L 29/6684* (2013.01); *H01L 29/7851* (2013.01); *H01L 29/78696* (2013.01)

(58) Field of Classification Search
CPC ....... H01L 21/28088; H01L 21/823842; H01L 21/823857; H01L 27/11585; H01L 29/40111; H01L 29/42376; H01L 29/4966; H01L 29/516; H01L 29/66545; H01L 29/6684; H01L 29/78391
See application file for complete search history.

(56) References Cited

U.S. PATENT DOCUMENTS

| | | | |
|---|---|---|---|
| 8,222,132 B2 | 7/2012 | Lee et al. | |
| 8,481,389 B2 | 7/2013 | Zhang et al. | |
| 8,951,855 B2 | 2/2015 | Lai et al. | |
| 9,018,711 B1 | 4/2015 | Cai et al. | |
| 9,299,619 B2 | 3/2016 | Zhao | |
| 9,865,703 B2 | 1/2018 | Ando et al. | |
| 10,141,414 B1 * | 11/2018 | Galatage | H01L 29/40111 |

(Continued)

*Primary Examiner* — David C Spalla
(74) *Attorney, Agent, or Firm* — Muir Patent Law, PLLC

(57) ABSTRACT

A semiconductor device includes a substrate including an active pattern, a gate electrode crossing the active pattern in a plan view, and a ferroelectric pattern interposed between the active pattern and the gate electrode. The gate electrode includes a work function metal pattern disposed on the ferroelectric pattern, and an electrode pattern filling a recess formed in an upper portion of the work function metal pattern. A top surface of a topmost portion of the ferroelectric pattern is lower than a bottom surface of the recess.

19 Claims, 32 Drawing Sheets

(56) References Cited

U.S. PATENT DOCUMENTS

| | | | |
|---|---|---|---|
| 2016/0042954 A1 | 2/2016 | Sung et al. | |
| 2016/0079067 A1 | 3/2016 | Chien et al. | |
| 2018/0006129 A1* | 1/2018 | Xing | H01L 29/42376 |
| 2018/0151745 A1* | 5/2018 | Chang | H01L 21/82345 |
| 2019/0019875 A1* | 1/2019 | Tsai | H01L 29/516 |
| 2019/0067488 A1* | 2/2019 | Tsai | H01L 27/0886 |
| 2019/0088760 A1* | 3/2019 | Lee | H01L 27/1104 |
| 2019/0096767 A1* | 3/2019 | Yeh | H01L 21/02181 |
| 2019/0131426 A1* | 5/2019 | Lu | H01L 21/28088 |
| 2019/0378904 A1* | 12/2019 | Yang | H01L 29/78391 |
| 2020/0006547 A1* | 1/2020 | Hsu | H01L 29/78391 |

* cited by examiner

SEMICONDUCTOR DEVICE

CROSS-REFERENCE TO RELATED APPLICATIONS

This U.S. non-provisional patent application claims priority under 35 U.S.C. § 119 to Korean Patent Application Nos. 10-2018-0078866 and 10-2019-0005360, filed on Jul. 6, 2018 and Jan. 15, 2019, respectively, in the Korean Intellectual Property Office, the entire contents of each of which are hereby incorporated by reference.

BACKGROUND OF THE INVENTION

The present disclosure relates to a semiconductor device, and in particular, to a semiconductor device including a field effect transistor and a method of fabricating the same.

A semiconductor device may include an integrated circuit including metal-oxide-semiconductor field-effect transistors (MOS-FETs). To meet an increasing demand for a semiconductor device with a small pattern size and a reduced design rule, MOS-FETs are being scaled down. The scale-down of MOS-FETs may lead to deterioration in operational properties of semiconductor devices. A variety of studies are being conducted to overcome technical limitations associated with a scale-down of semiconductor devices and to realize high performance semiconductor devices.

SUMMARY

Embodiment of the inventive concept provide a semiconductor device with improved electric characteristics.

According to an embodiment of the inventive concept, a semiconductor device may include a substrate including an active pattern, a gate electrode crossing the active pattern in a plan view, and a ferroelectric pattern interposed between the active pattern and the gate electrode. The gate electrode may include a work function metal pattern disposed on the ferroelectric pattern, and an electrode pattern filling a recess formed in an upper portion of the work function metal pattern. A top surface of a topmost portion of the ferroelectric pattern may be lower than a bottom surface of the recess.

According to an embodiment of the inventive concept, a semiconductor device may include a substrate including a first active pattern and a second active pattern, a gate electrode crossing the first and second active patterns in a plan view, and a ferroelectric pattern interposed between the first and second active patterns and the gate electrode. The gate electrode may include a work function metal pattern disposed on the ferroelectric pattern, a recess formed in an upper portion of the work function metal pattern, and an electrode pattern formed in the recess. A height difference between a bottom surface of the recess and a top surface of a topmost portion of the ferroelectric pattern formed on the first active pattern may be different from a height difference between a bottom surface of the recess and a top surface of a topmost portion of the ferroelectric pattern formed on the second active pattern.

According to an embodiment of the inventive concept, a semiconductor device may include a substrate including an active pattern, a gate electrode crossing the active pattern in a plan view, a gate spacer disposed on a side surface of the gate electrode, and a ferroelectric pattern interposed between the active pattern and the gate electrode. The ferroelectric pattern may include a first portion disposed on a top surface of the active pattern and a second portion extending from the first portion along an inner sidewall of the gate spacer. The gate electrode may include a first work function metal pattern disposed on the ferroelectric pattern and a second work function metal pattern disposed on the first work function metal pattern. The second work function metal pattern may cover a top surface of the second portion of the ferroelectric pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
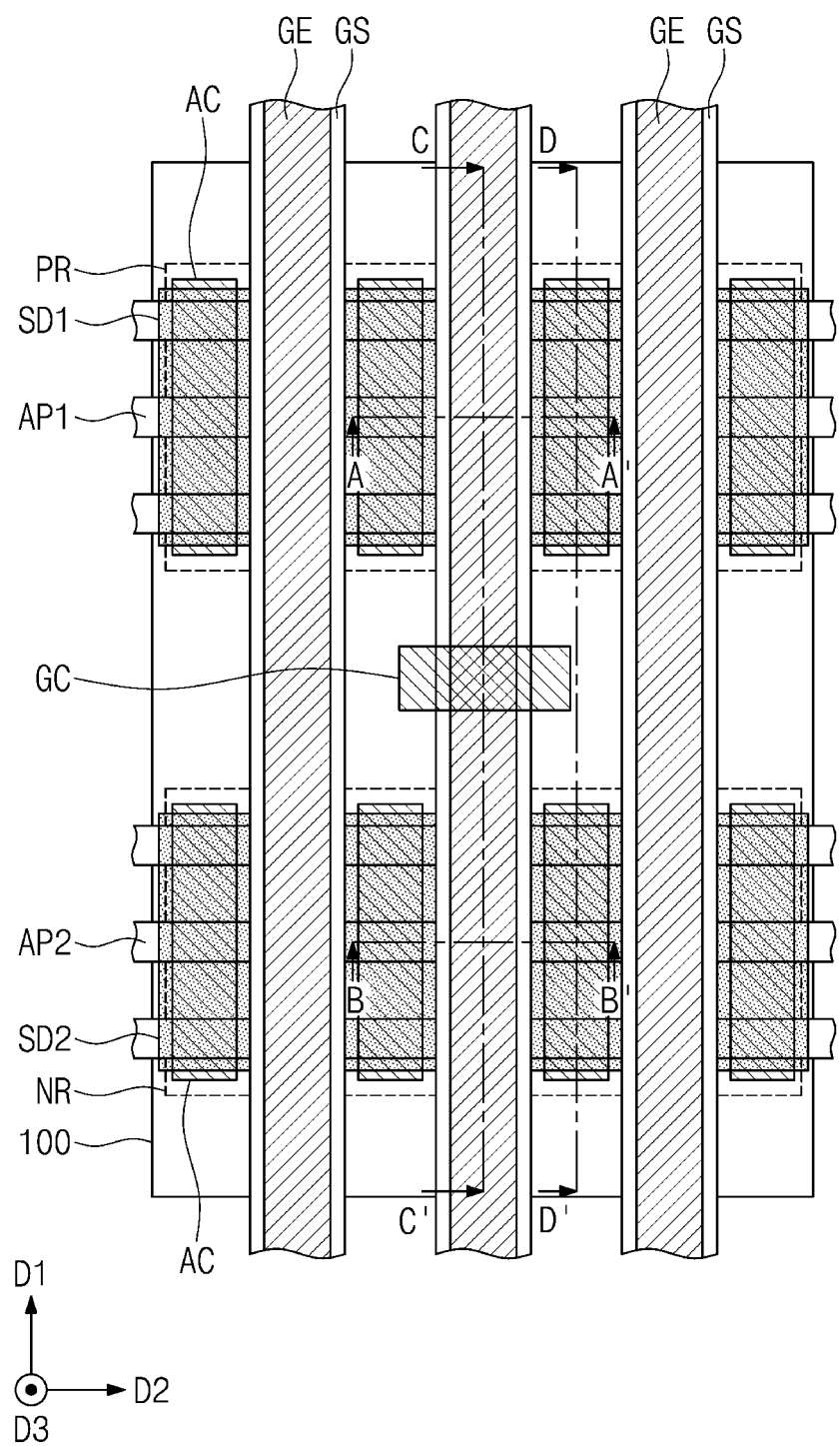
FIG. 1 is a plan view illustrating a semiconductor device according to an embodiment of the inventive concept.
Figure 2A:
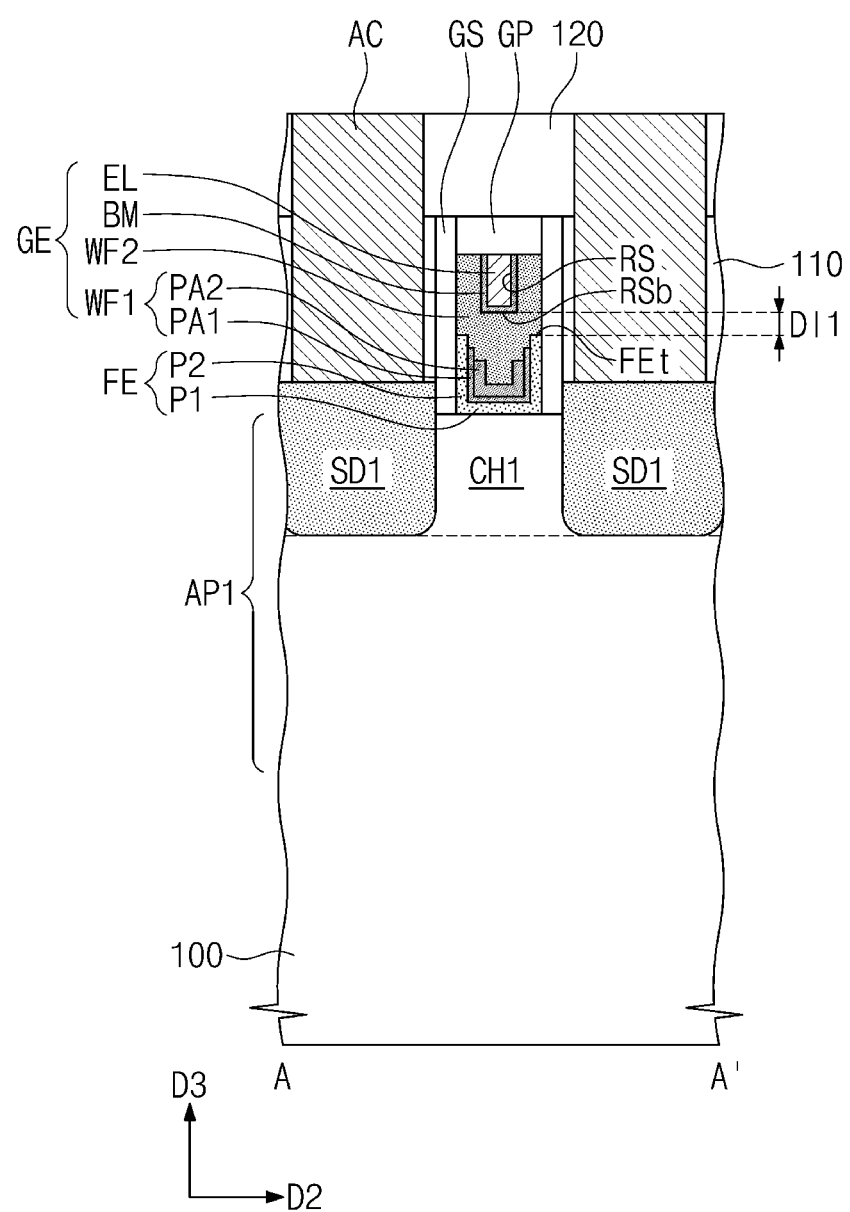
FIGS. 2A to 2D are sectional views respectively taken along lines A-A', B-B', C-C', and D-D' of FIG. 1.
Figure 2B:
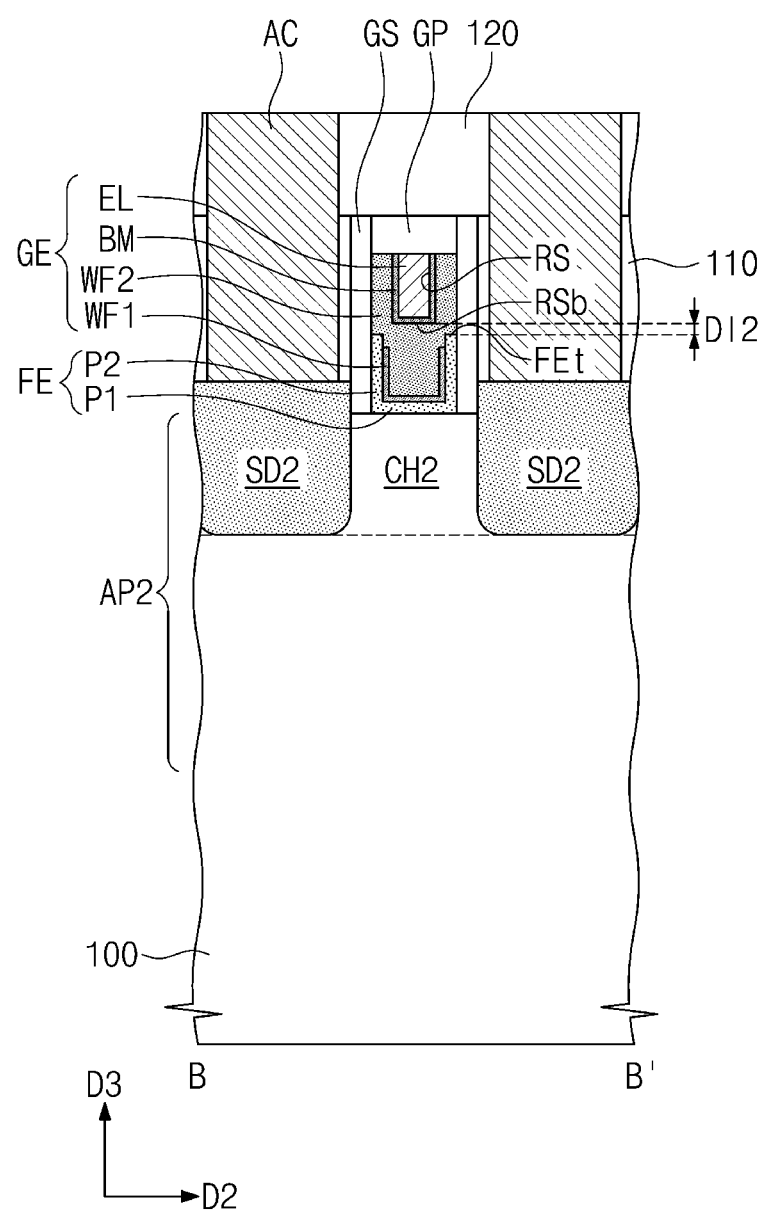
Figure 2C:
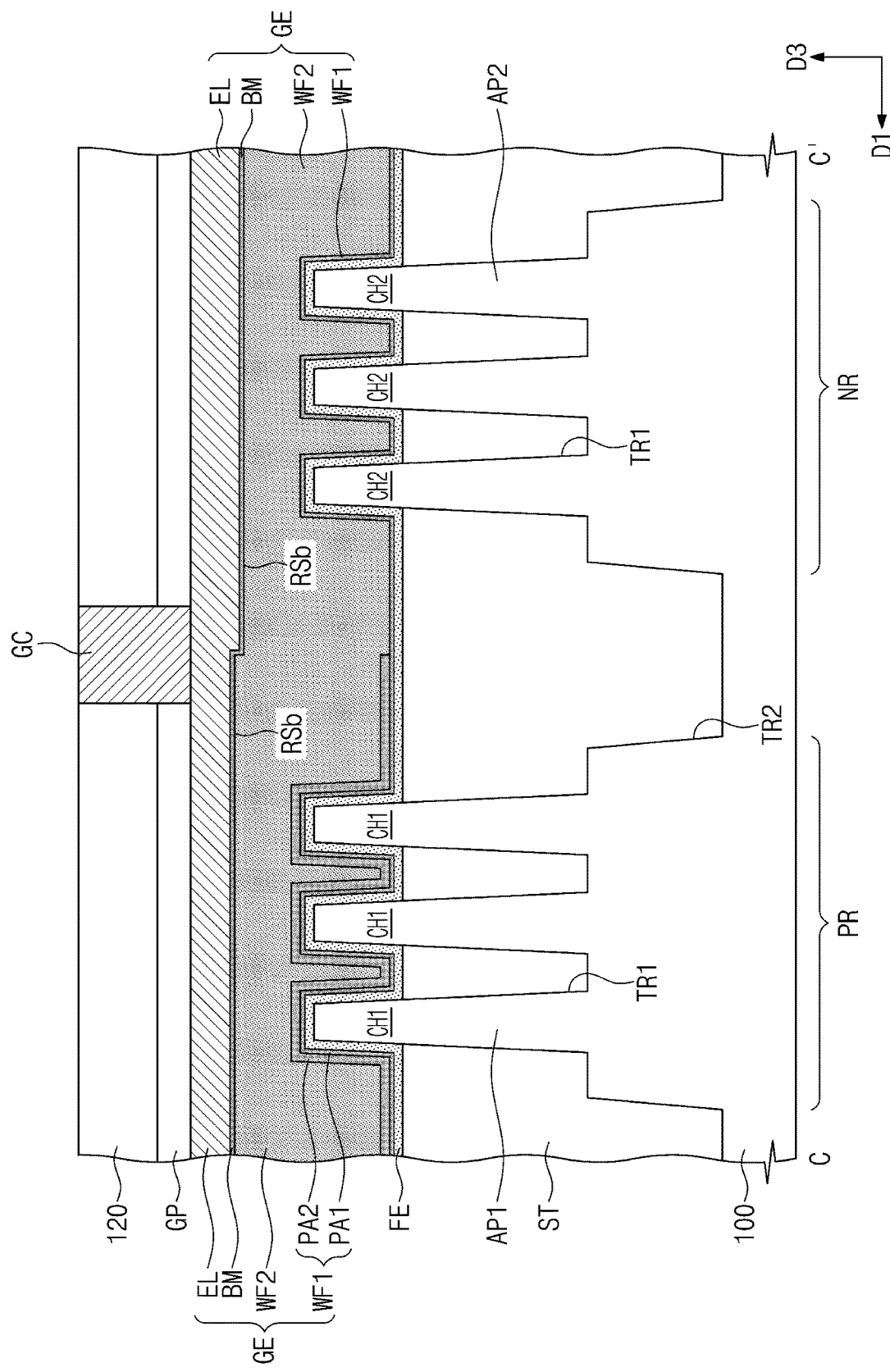
Figure 2D:
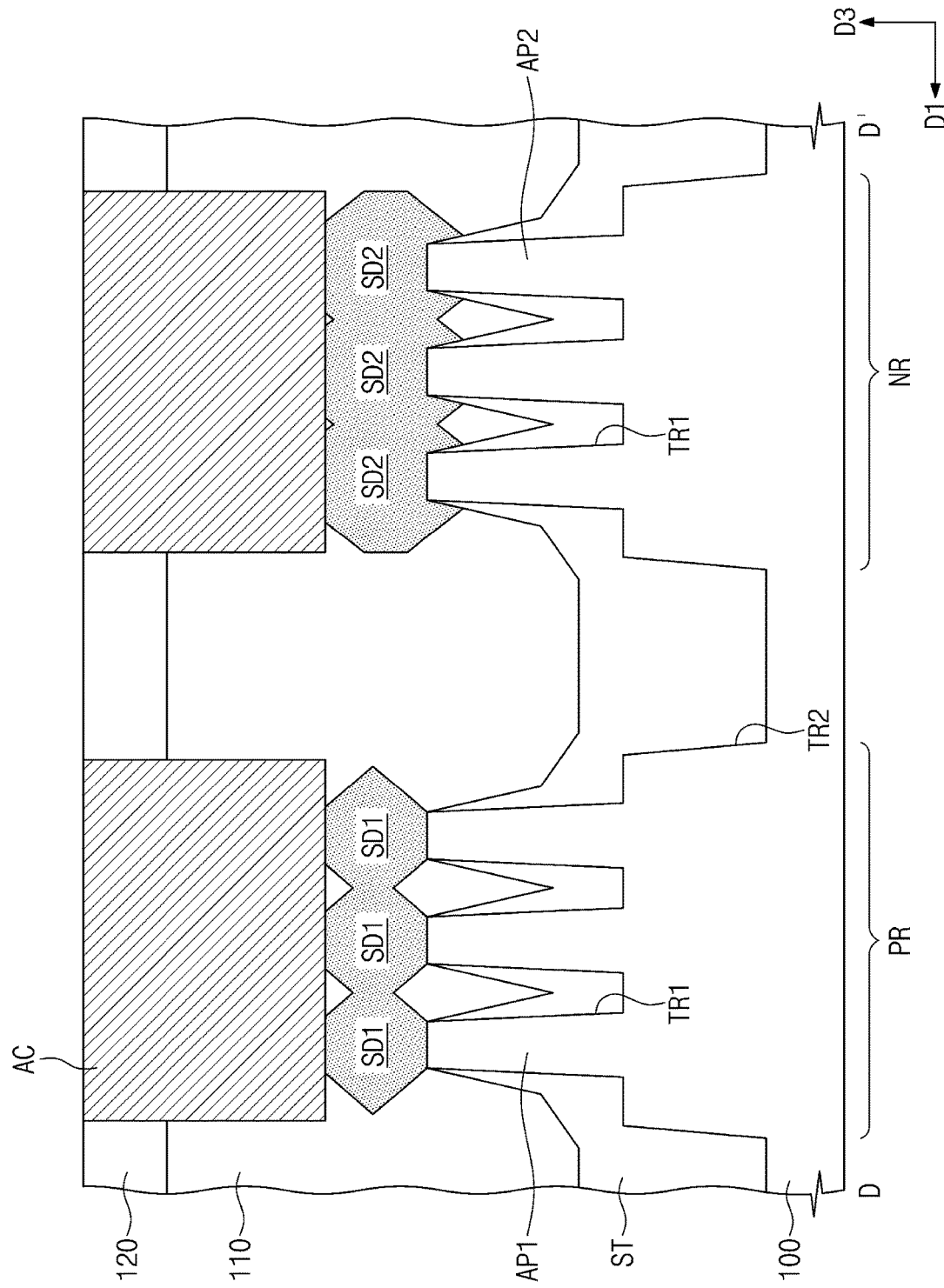

FIG. 1 is a plan view illustrating a semiconductor device according to an embodiment of the inventive concept. FIGS. 2A to 2D are sectional views respectively taken along lines A-A', B-B', C-C', and D-D' of FIG. 1.

Referring to FIG. 1 and FIGS. 2A to 2D, a substrate 100 including a PMOSFET region PR and an NMOSFET region NR may be provided. The substrate 100 may be a semiconductor substrate (e.g., of silicon, germanium, or silicon-germanium) or a compound semiconductor substrate. As an example, the substrate 100 may be a silicon wafer.

In an embodiment, the PMOSFET region PR and the NMOSFET region NR may be a logic cell region, on which logic transistors constituting a logic circuit of a semiconductor device are integrated. As an example, logic transistors constituting the logic circuit may be disposed on the logic cell region of the substrate 100. The PMOSFET region PR and the NMOSFET region NR may include some of the logic transistors.

First and second trenches TR1 and TR2 may be formed in an upper portion of the substrate 100. The second trench TR2 may be formed in an upper portion of the substrate 100 to define the PMOSFET region PR and the NMOSFET region NR. The second trench TR2 may be located between the PMOSFET region PR and the NMOSFET region NR. The PMOSFET region PR and the NMOSFET region NR may be spaced apart from each other in a first direction D1 with the second trench TR2 interposed therebetween. Each of the PMOSFET region PR and the NMOSFET region NR may extend in a second direction D2 crossing the first direction D1.

First active patterns AP1 and second active patterns AP2 may be provided on the PMOSFET region PR and the NMOSFET region NR, respectively. The first and second active patterns AP1 and AP2 may extend in the second direction D2. The first and second active patterns AP1 and AP2 may be portions of the substrate 100, which have a vertically protruding shape from an upper surface of the substrate 100. The first trench TR1 may be formed between and defined by two adjacent active patterns of the first active patterns AP1 or two adjacent active patterns of the second active patterns AP2. The first trench TR1 may be shallower than the second trench TR2.

A device isolation layer ST may be provided to fill the first and second trenches TR1 and TR2. The device isolation layer ST may include a silicon oxide layer. Upper portions of the first and second active patterns AP1 and AP2 may have a shape vertically protruding above the device isolation layer ST (e.g., see FIG. 2C). Each of the upper portions of the first and second active patterns AP1 and AP2 may have a fin shape. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided on the upper portions of the first active patterns AP1. The first source/drain patterns SD1 may be impurity regions of a first conductivity type (e.g., p-type). A first channel region CH1 may be interposed between each pair of the first source/drain patterns SD1. Second source/drain patterns SD2 may be provided on the upper portions of the second active patterns AP2. The second source/drain patterns SD2 may be impurity regions of a second conductivity type (e.g., n-type). A second channel region CH2 may be interposed between each pair of the second source/drain patterns SD2.

The first and second source/drain patterns SD1 and SD2 may be epitaxial patterns that are formed by a selective epitaxial growth process. The first and second source/drain patterns SD1 and SD2 may have top surfaces that are positioned at a higher level than those of the first and second channel regions CH1 and CH2. In an embodiment, the first source/drain patterns SD1 may include a semiconductor material (e.g., SiGe) having a lattice constant greater than that of the semiconductor material included in the substrate 100. In this case, the first source/drain patterns SD1 may exert a compressive stress to the first channel regions CH1.

In an embodiment, the second source/drain patterns SD2 may include the same semiconductor material (e.g., Si) as that of the substrate 100.

Gate electrodes GE may be provided to cross the first and second active patterns AP1 and AP2, e.g., in a plan view, and to extend in the first direction D1. The gate electrodes GE may be spaced apart from each other in the second direction D2. The gate electrodes GE may be vertically overlapped with the first and second channel regions CH1 and CH2. Each of the gate electrodes GE may be provided to face a top surface and opposite side surfaces of each of the first and second channel regions CH1 and CH2 (e.g., see FIG. 2C). For example, the opposite side surfaces of each of the first and second channel regions CH1 and CH2 may respectively correspond to portions of side surfaces of the fin shapes of the active patterns AP1 and AP2, and the opposite side surfaces of each of the first and second channel regions CH1 and CH2 may be spaced apart from each other in the first direction D1.

A pair of gate spacers GS may be respectively disposed on opposite side surfaces of each of the gate electrodes GE. The gate spacers GS may extend along the gate electrodes GE and in the first direction D1. The gate spacers GS may have top surfaces higher than top surfaces of the gate electrodes GE, e.g., in a third direction D3 perpendicular to the first and second directions D1 and D2. The top surfaces of the gate spacers GS may be coplanar with a top surface of a first interlayered insulating layer 110, which will be described below. The gate spacers GS may be formed of or include at least one of SiCN, SiCON, or SiN. In certain embodiments, the gate spacers GS may have a multi-layered structure including at least two of SiCN, SiCON, or SiN layers.

A gate capping pattern GP may be provided on each of the gate electrodes GE. The gate capping pattern GP may extend along the gate electrode GE and in the first direction D1. The gate capping pattern GP may be formed of or include at least one of materials, which are selected to have an etch selectivity with respect to first and second interlayered insulating layers 110 and 120 to be described below. For example, the gate capping patterns GP may be formed of or include at least one of SiON, SiCN, SiCON, or SiN. For example, the gate capping patterns GP may have an etching selectivity with respect to the first and second interlayered insulating layers 110 and 120.

A ferroelectric pattern FE may be interposed between the gate electrode GE and the first active pattern AP1 and between the gate electrode GE and the second active pattern AP2. The ferroelectric pattern FE may extend, e.g., in the first direction D1, along a bottom surface of the gate electrode GE thereon. As an example, the ferroelectric pattern FE may cover a top surface and opposite side surfaces of the first channel region CH1. The ferroelectric pattern FE may cover a top surface and opposite side surfaces of the second channel region CH2. The ferroelectric pattern FE may cover a top surface of the device isolation layer ST below the gate electrode GE (e.g., see FIG. 2C). For example, the ferroelectric pattern FE may be disposed between the gate electrode GE and the device isolation layer ST.

Referring back to FIGS. 2A and 2B, the ferroelectric pattern FE may include a first portion P1, which is provided on the top surface of each of the first and second channel regions CH1 and CH2, and a second portion P2, which extends vertically from the first portion P1. The second portion P2 may vertically extend along an inner sidewall of the gate spacer GS (i.e., in the third direction D3). A top surface FEt of the second portion P2 may be lower than a top surface of the gate electrode GE. For example, the first portion P1 of the ferroelectric pattern FE may be interposed between the gate electrode GE and each of the channel regions CH1 and CH2, and the second portion P2 of the ferroelectric pattern FE may be interposed between the gate electrode GE and the gate spacer GS.

In an embodiment, the ferroelectric pattern FE may serve as a negative capacitor. For example, when an external voltage is applied to the ferroelectric pattern FE, owing to movement of dipoles in the ferroelectric pattern FE, a phase of the ferroelectric pattern FE may be changed to a state different from its initial polarization state, and thus, a negative capacitance effect may occur. In this case, a total capacitance of the transistor including the ferroelectric pattern FE may be increased, and this may make it possible to improve sub-threshold swing characteristics of the transistor and to reduce an operation voltage.

The ferroelectric pattern FE may include hafnium oxide, which contains at least one of zirconium (Zr), silicon (Si), aluminum (Al), or lanthanum (La) or is doped with at least one of zirconium (Zr), silicon (Si), aluminum (Al), or lanthanum (La). In the case where hafnium oxide is doped in a specific ratio with at least one of zirconium (Zr), silicon (Si), aluminum (Al), or lanthanum (La), at least a portion of the ferroelectric pattern FE may have an orthorhombic crystal structure. When at least a portion of the ferroelectric pattern FE has an orthorhombic crystal structure, a negative capacitance effect may occur. A volume ratio of a portion of the orthorhombic crystal structure, to a total volume of the ferroelectric pattern FE may range from 10% to 50%. For example, the volume of the orthorhombic crystal structure may range from 10 to 50% of the total volume of the ferroelectric pattern FE.

In the case where the ferroelectric pattern FE includes zirconium-doped hafnium oxide (ZrHfO), a ratio of the number of Zr atoms to the number of Zr and Hf atoms (i.e., Zr/(Hf+Zr)) may range from 45 at % to 55 at %. In the case where the ferroelectric pattern FE includes silicon-doped hafnium oxide (SiHfO), a ratio of the number of Si atoms to the number of Si and Hf atoms (i.e., Si/(Hf+Si)) may range from 4 at % to 6 at %. In the case where the ferroelectric pattern FE includes aluminum-doped hafnium oxide (AlHfO), a ratio of the number of Al atoms to the number of Al and Hf atoms (i.e., Al/(Hf+Al)) may range from 5 at % to 10 at %. In the case where the ferroelectric pattern FE includes lanthanum-doped hafnium oxide (LaHfO), a ratio of the number of La atoms to the number of La and Hf atoms (i.e., La/(Hf+La)) may range from 5 at % to 10 at %.

Referring back to FIG. 1 and FIGS. 2A to 2D, each of the gate electrodes GE may include a first work function metal pattern WF1, a second work function metal pattern WF2, a barrier pattern BM, and an electrode pattern EL, which are sequentially stacked. The first work function metal pattern WF1 may be provided on the ferroelectric pattern FE. For example, the ferroelectric pattern FE may be interposed between the first work function metal pattern WF1 and the first and second channel regions CH1 and CH2.

Referring back to FIGS. 2A and 2B, the first work function metal pattern WF1 may have a shape similar to that of the ferroelectric pattern FE. For example, the first work function metal pattern WF1 may cover the first portion P1 of the ferroelectric pattern FE and may vertically extend along the second portion P2. As an example, a top surface of the first work function metal pattern WF1 may be lower than the top surface FEt of the second portion P2 of the ferroelectric pattern FE. The second work function metal pattern WF2 may cover the first work function metal pattern WF1. The second work function metal pattern WF2 may cover the top surface FEt of the second portion P2 of the ferroelectric pattern FE.

The first work function metal pattern WF1 may include a metal nitride layer (e.g., a titanium nitride layer (TiN) or a tantalum nitride layer (TaN)). The second work function metal pattern WF2 may include a metal carbide layer, which contains aluminum or silicon or is doped with aluminum or silicon. As an example, the second work function metal pattern WF2 may include TiAlC, TaAlC, TiSiC or TaSiC. The first and second work function metal patterns WF1 and WF2 may be helpful to allow the transistors (e.g., PMOSFET and NMOSFET) to have a proper threshold voltage in combination with the other patterns included in the gate electrode GE. For example, the first and second work function patterns WF1 and WF2 may be helpful to reduce the threshold voltage of the transistors.

The second work function metal pattern WF2 may include a recess RS, which is formed in an upper portion thereof. The barrier pattern BM and the electrode pattern EL may fill the recess RS of the second work function metal pattern WF2. The barrier pattern BM may be interposed between the second work function metal pattern WF2 and the electrode pattern EL to prevent a metallic element from being diffused between the second work function metal pattern WF2 and the electrode pattern EL. The barrier pattern BM may include a metal nitride layer (e.g., a titanium nitride layer (TiN)). The electrode pattern EL may have an electric resistance lower than electric resistances of the first work function metal pattern WF1 and the second work function metal pattern WF2. As an example, the electrode pattern EL may include at least one of low resistance metals including aluminum (Al), tungsten (W), titanium (Ti), and tantalum (Ta).

The recess RS may have a bottom surface RSb, which is higher than the top surface FEt of the second portion P2 of the ferroelectric pattern FE. Since the second portion P2 of the ferroelectric pattern FE is chamfered, an upper portion of the second work function metal pattern WF2 may partially fill a space between a pair of the gate spacers GS. Thus, the recess RS may be defined in the upper portion of the second work function metal pattern WF2. For example, because the top surface of the second portion P2 of the ferroelectric pattern FE is lower than the bottom of the recess RS, the second work function metal pattern WF2 may fill between the gate spacers GS at the portion above the second portion P2 of the ferroelectric pattern FE and below the recess RS.

Referring back to FIG. 1 and FIGS. 2A to 2D, the first work function metal pattern WF1 on the PMOSFET region PR may include a plurality of sequentially-stacked patterns. As an example, the first work function metal pattern WF1 on the PMOSFET region PR may include a first pattern PA1 and a second pattern PA2 disposed on the first pattern PA1. A level of the topmost portion of the second pattern PA2 may be lower than a level of the topmost portion of the first pattern PA1. A thickness of the second pattern PA2 may be different from a thickness of the first pattern PA1. The first pattern PA1 and the second pattern PA2 may include different materials or the same material. As an example, both of the first pattern PA1 and the second pattern PA2 may include titanium nitride (TiN). For example each of the first and second patterns PA1 and PA2 may be a titanium nitride layer.

The first work function metal pattern WF1 on the NMOSFET region NR may include a single pattern. For example, the second pattern PA2, which is provided in the first work function metal pattern WF1 on the PMOSFET region PR, may be omitted from the first work function metal pattern WF1 on the NMOSFET region NR. Thus, a thickness of the first work function metal pattern WF1 on the NMOSFET region NR may be smaller than a thickness of the first work function metal pattern WF1 on the PMOSFET region PR.

The bottom surface RSb of the recess RS of the second work function metal pattern WF2 on the PMOSFET region PR may be higher than the bottom surface RSb of the recess RS of the second work function metal pattern WF2 on the NMOSFET region NR. A width of the recess RS of the second work function metal pattern WF2 on the PMOSFET region PR in the second direction D2 may be smaller than a width of the recess RS of the second work function metal pattern WF2 on the NMOSFET region NR in the second direction D2. This is because a thickness of the first work function metal pattern WF1 on the NMOSFET region NR is smaller than a thickness of the first work function metal pattern WF1 on the PMOSFET region PR.

A first height difference DI1 between the bottom surface RSb of the recess RS on the PMOSFET region PR and the top surface FEt of the topmost portion of the ferroelectric pattern FE may be different from a second height difference DI2 between the bottom surface RSb of the recess RS on the NMOSFET region NR and the top surface FEt of the topmost portion of the ferroelectric pattern FE. As an example, the first height difference DI1 may be greater than the second height difference DI2.

A first interlayered insulating layer 110 may be provided on the substrate 100. The first interlayered insulating layer 110 may cover the gate spacers GS and the first and second source/drain patterns SD1 and SD2. A top surface of the first interlayered insulating layer 110 may be substantially coplanar with top surfaces of the gate capping patterns GP and top surfaces of the gate spacers GS. A second interlayered insulating layer 120 may be disposed on the first interlayered insulating layer 110 to cover the gate capping patterns GP. As an example, the first and second interlayered insulating layers 110 and 120 may include silicon oxide.

At least one active contact AC may be disposed between a pair of the gate electrodes GE to penetrate the first and second interlayered insulating layers 110 and 120 and may be electrically connected to the first and second source/drain patterns SD1 and SD2. The active contact AC may include at least one of metallic materials (e.g., aluminum, copper, tungsten, molybdenum, and cobalt).

A metal silicide layer (not shown) may be interposed between the first and second source/drain patterns SD1 and SD2 and the active contact AC. The active contact AC may be electrically connected to the first and second source/drain patterns SD1 and SD2 through the metal silicide layer. The metal silicide layer may include at least one of metal silicide materials including titanium silicide, tantalum silicide, tungsten silicide, nickel silicide, and cobalt silicide.

The device isolation layer ST may include a first device isolation layer ST1 formed in the first trench TR1 and a second device isolation layer ST2 formed in the second trench TR2. At least one gate contact GC may be disposed on the second device isolation layer ST2 to penetrate the second interlayered insulating layer 120 and the gate capping pattern GP and may be electrically connected to the gate electrode GE. The gate contact GC may include the same metal material as the active contact AC. In certain embodiments, the gate contact GC may contact the second device isolation layer ST2 as shown in FIG. 1.

According to an embodiment of the inventive concept, the ferroelectric pattern FE may be provided between the gate electrode GE and the channel regions CH1 and CH2. The ferroelectric pattern FE may include an orthorhombic crystal structure, causing a negative capacitance effect. As a result, sub-threshold swing characteristics of the transistor may be improved and an operation voltage of the transistor may be reduced.

Figure 6A:
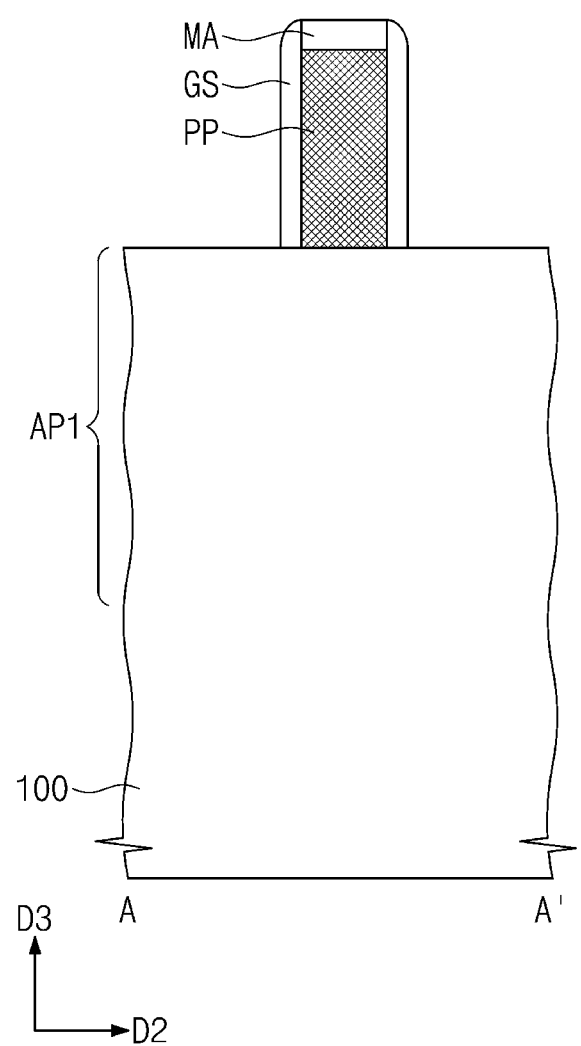
Figure 6B:
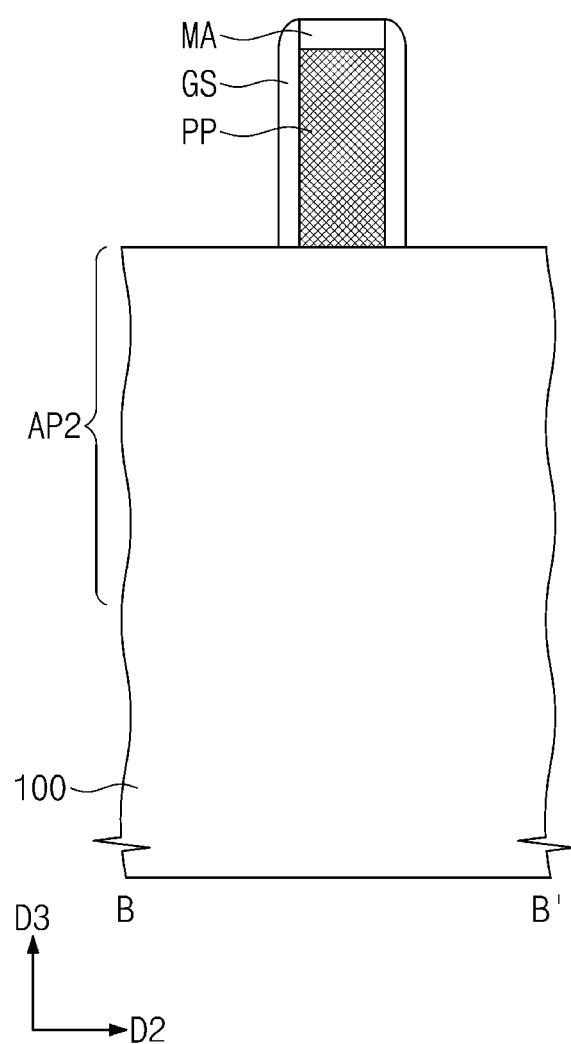
FIGS. 6B, 8B, and 10B are sectional views taken along lines B-B' of FIGS. 5, 7, and 9, respectively.
Figure 6C:
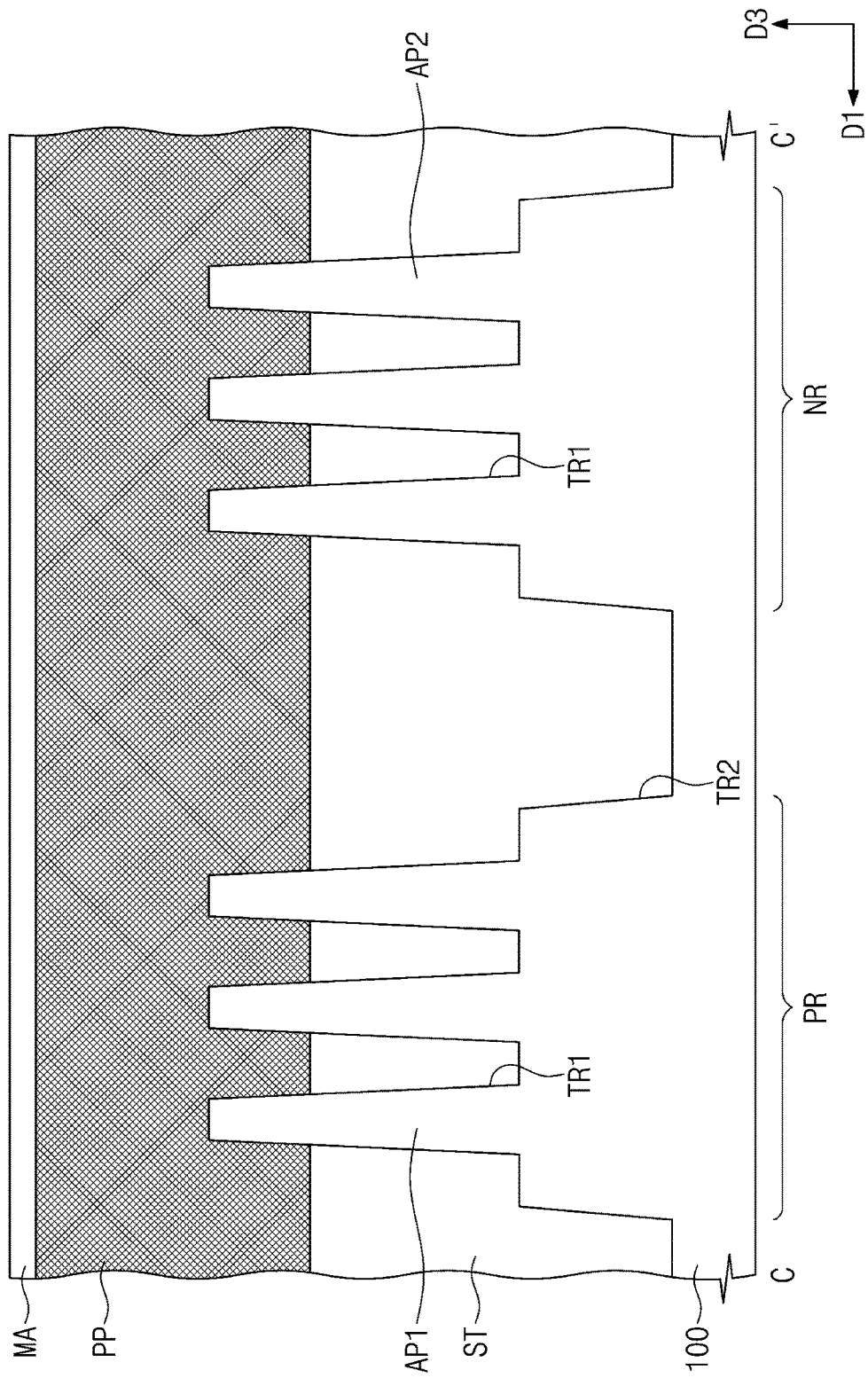
FIGS. 6C, 8C, and 10C are sectional views taken along lines C-C' of FIGS. 5, 7, and 9, respectively.
Figure 6D:
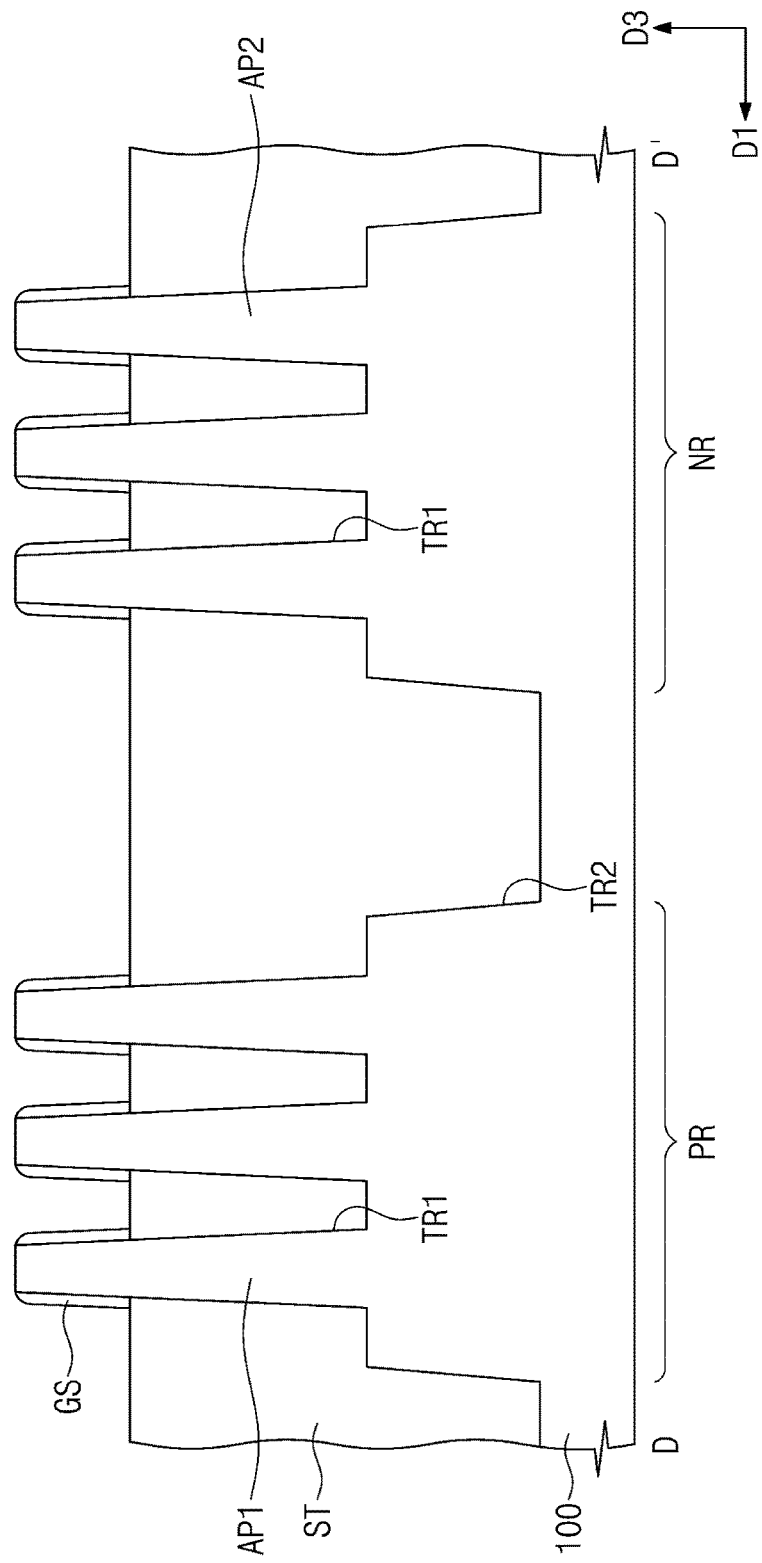
FIGS. 6D, 8D, and 10D are sectional views taken along lines D-D' of FIGS. 5, 7, and 9, respectively.
Figure 7:
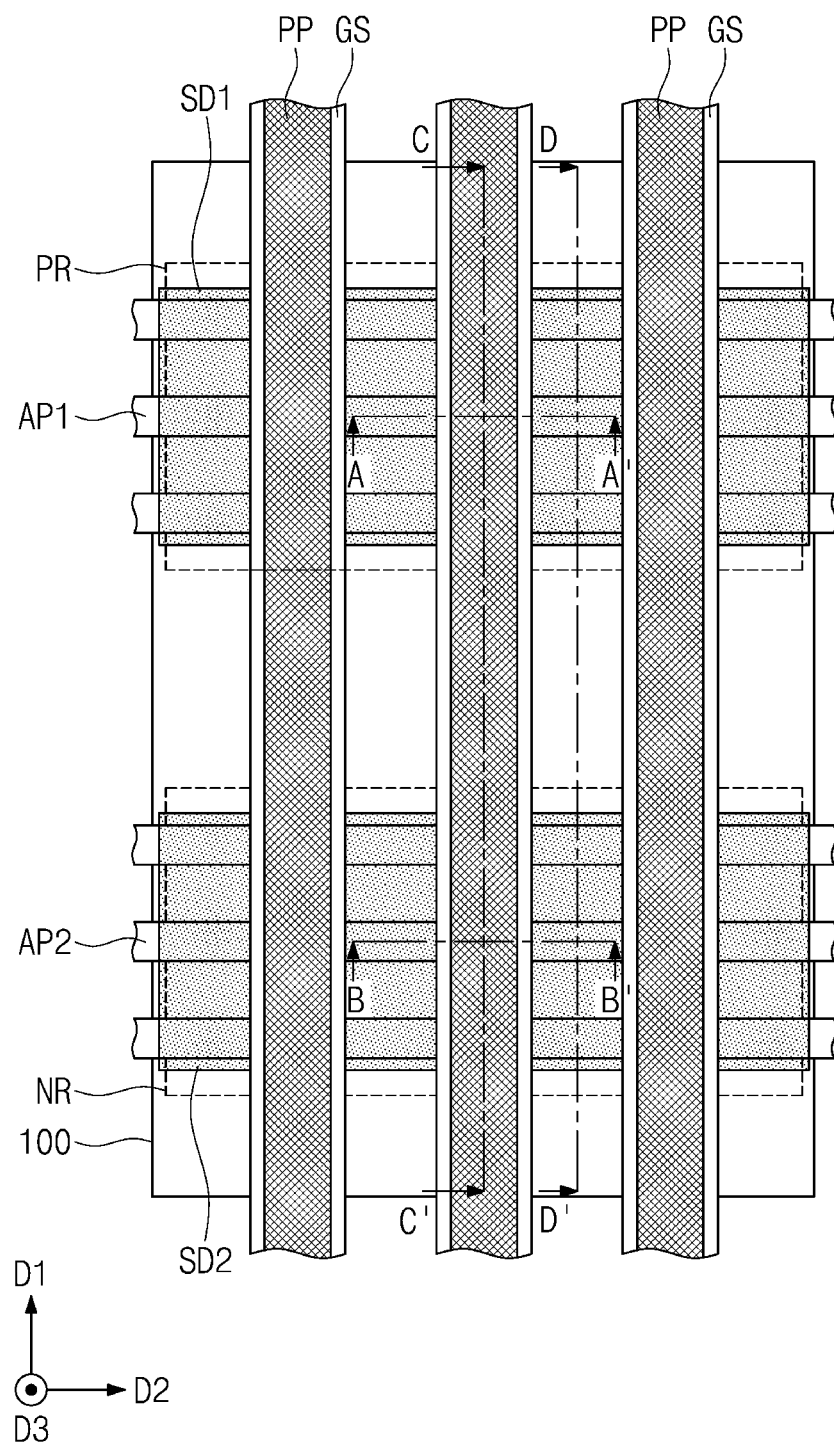
Figure 8A:
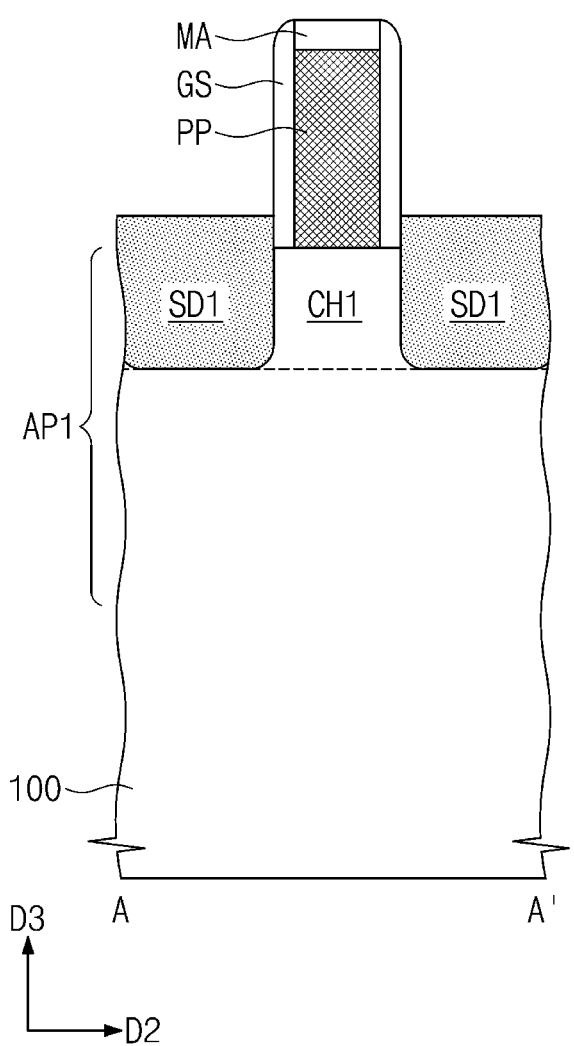
Figure 8B:
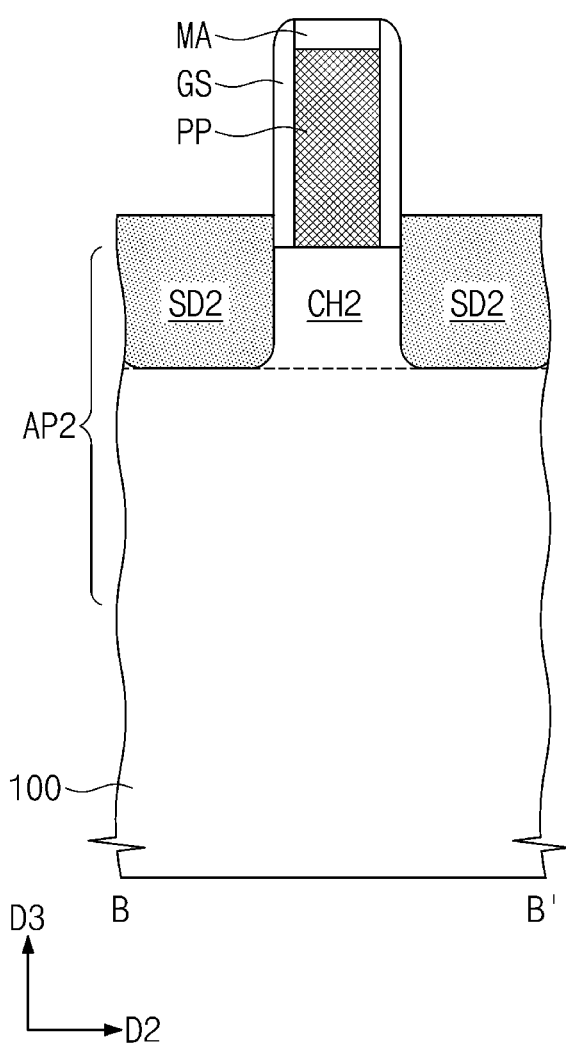
Figure 8C:
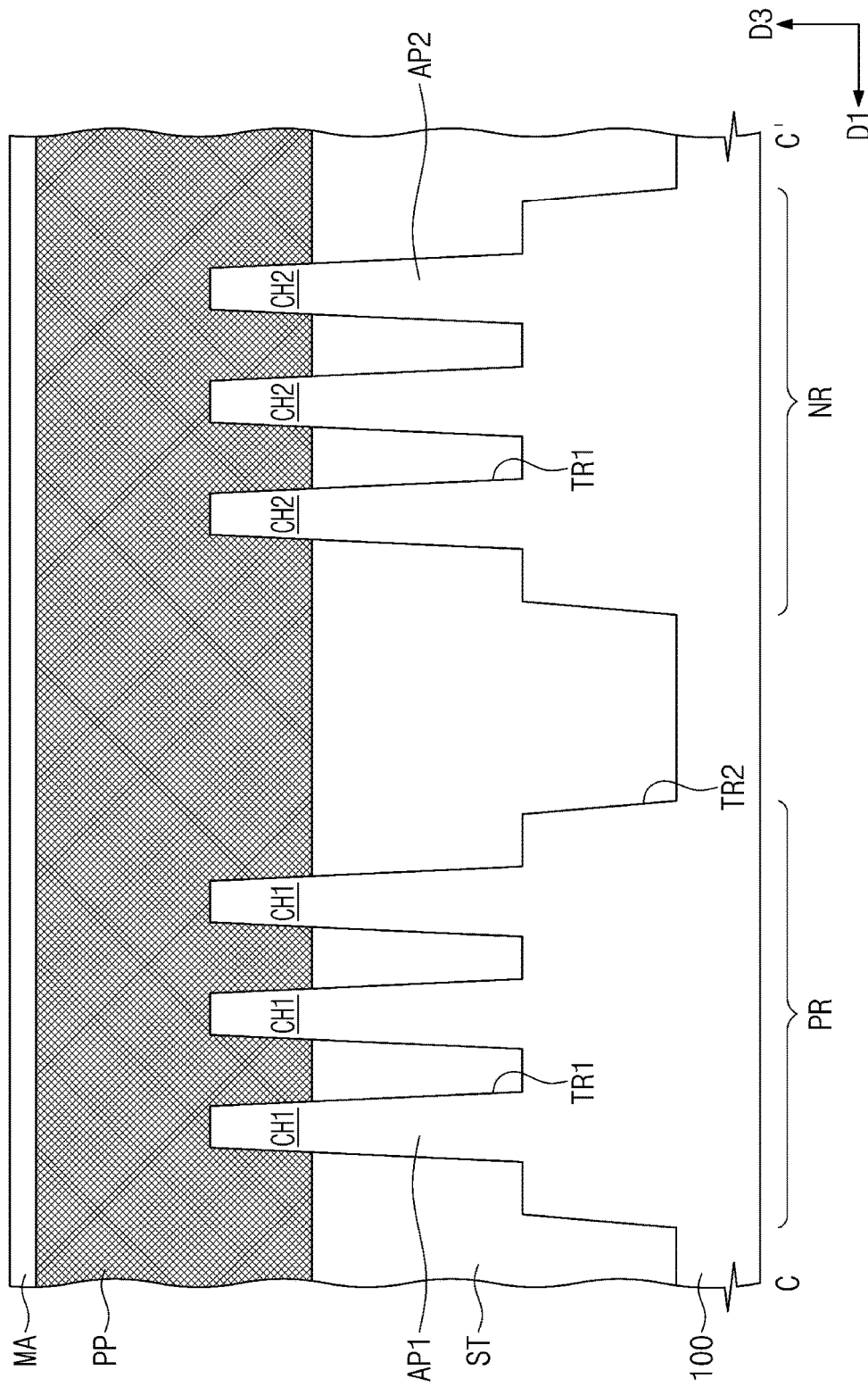
Figure 8D:
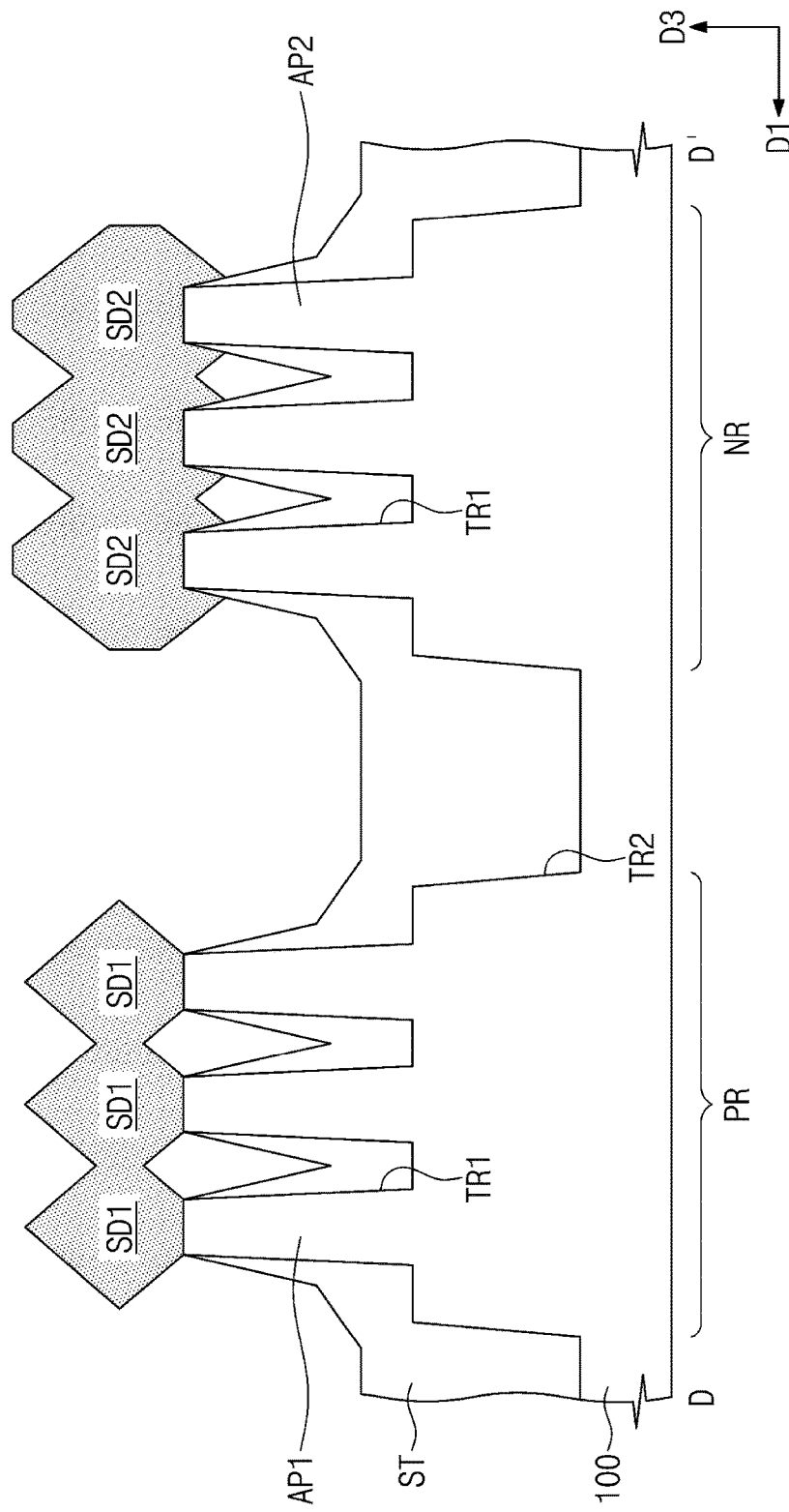
Figure 9:
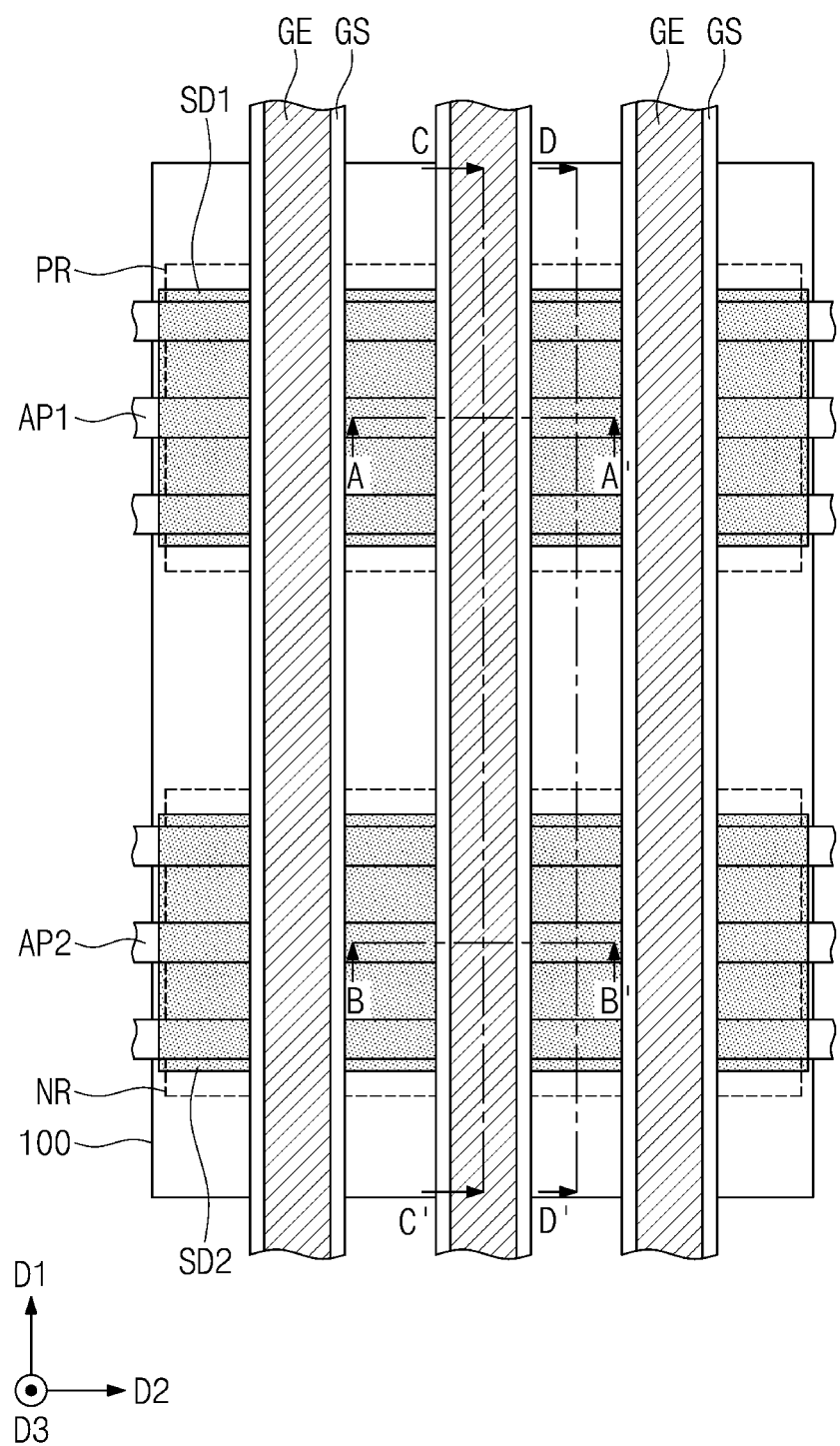
Figure 10A:
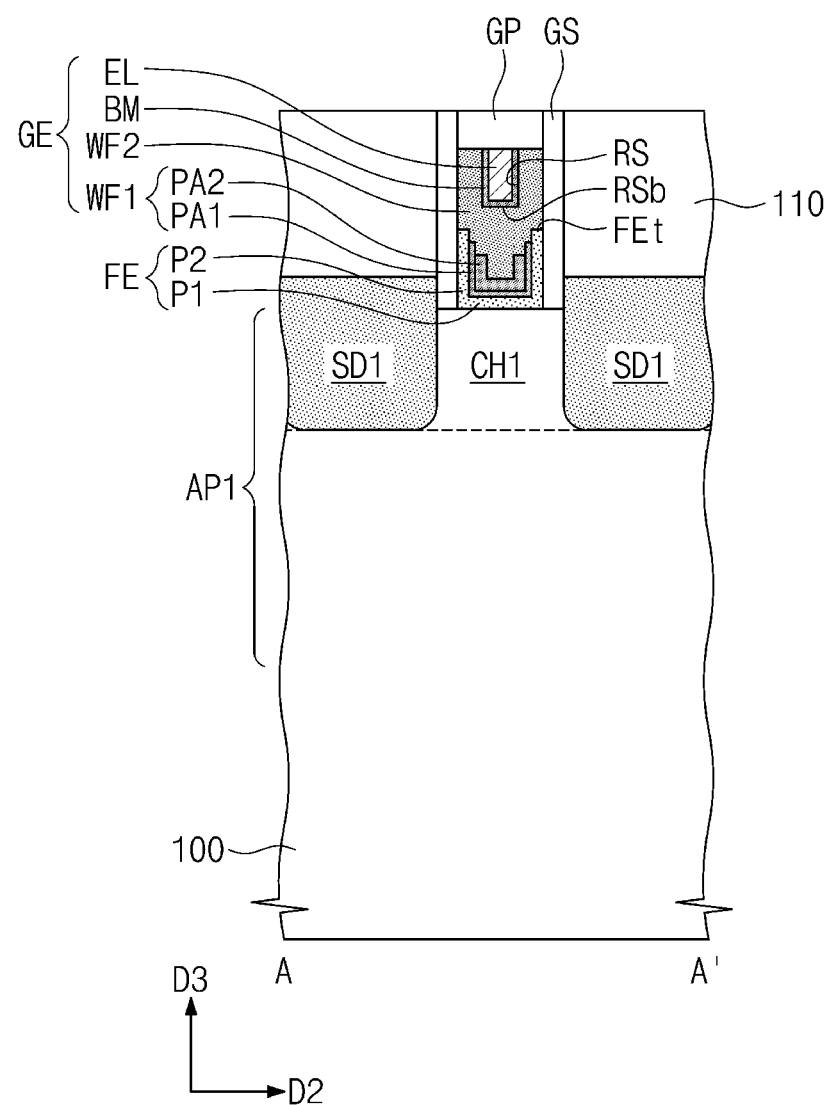
Figure 10B:
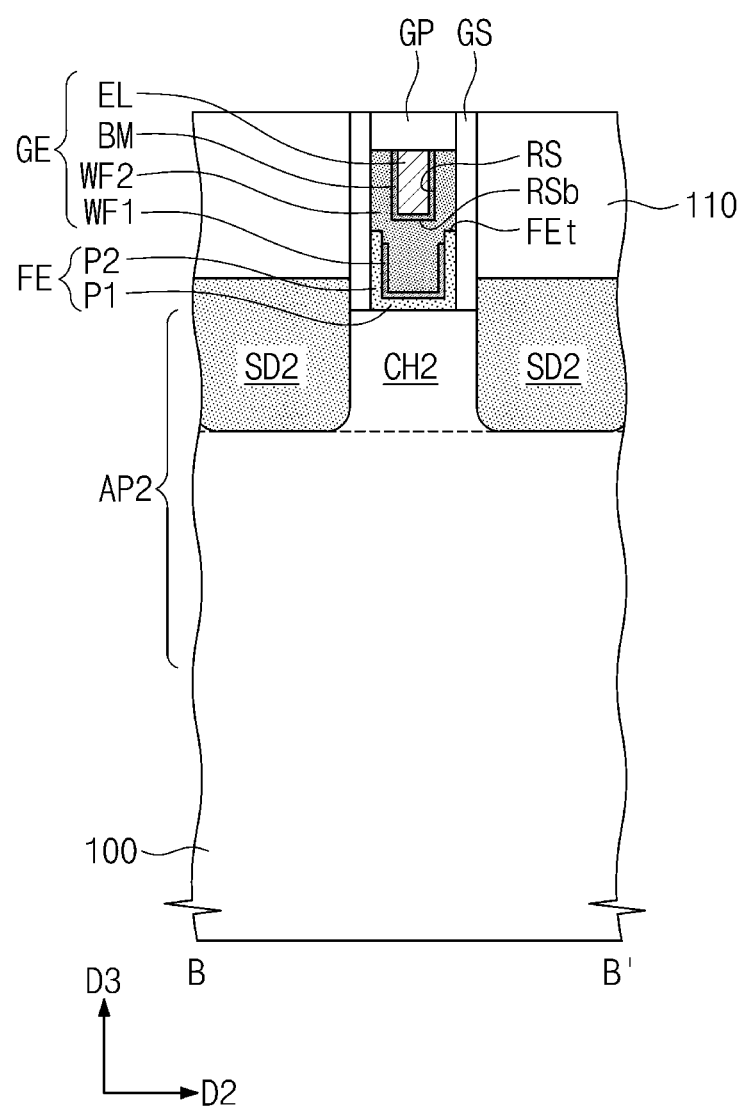
Figure 10C:
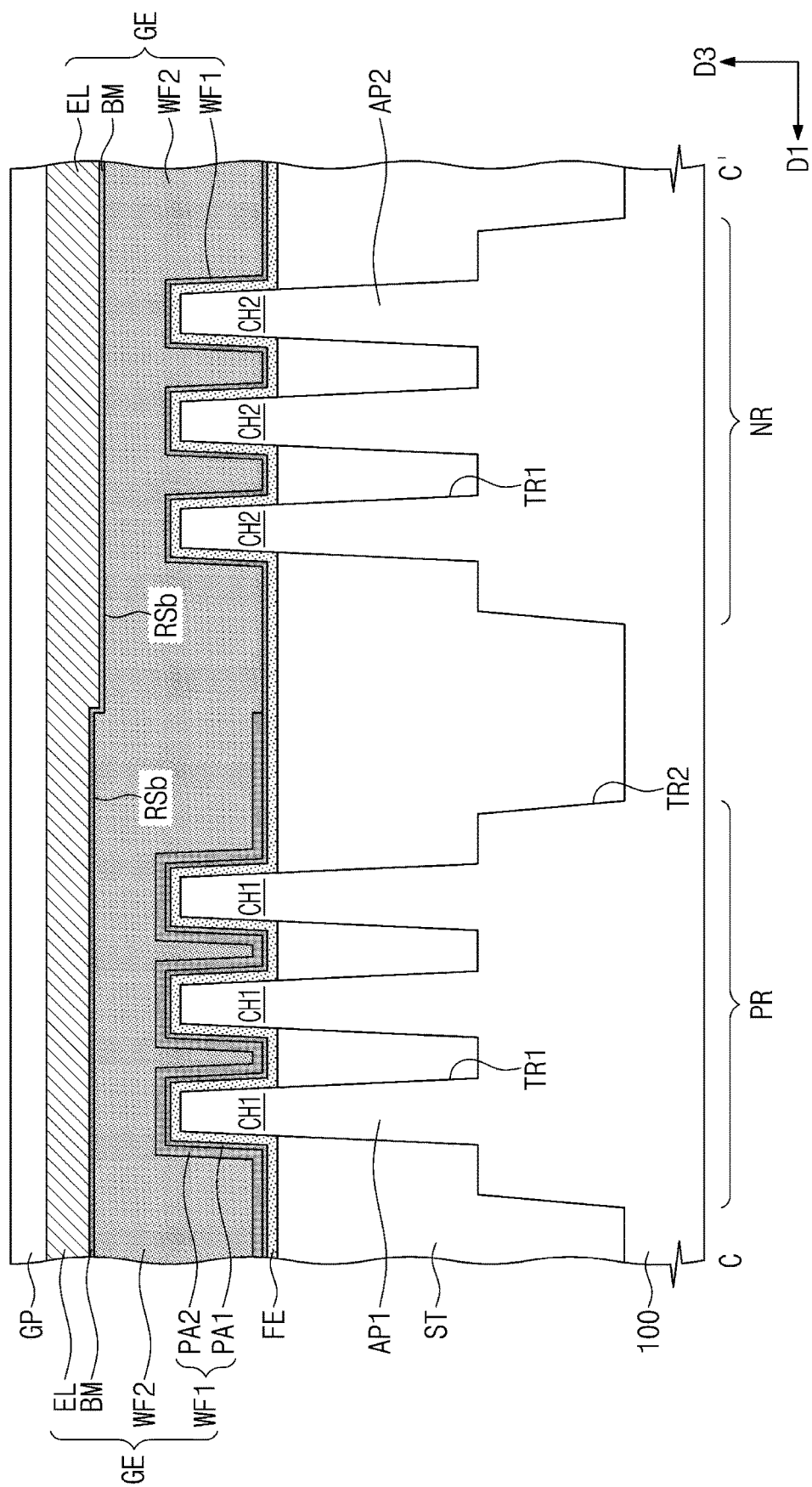
Figure 10D:
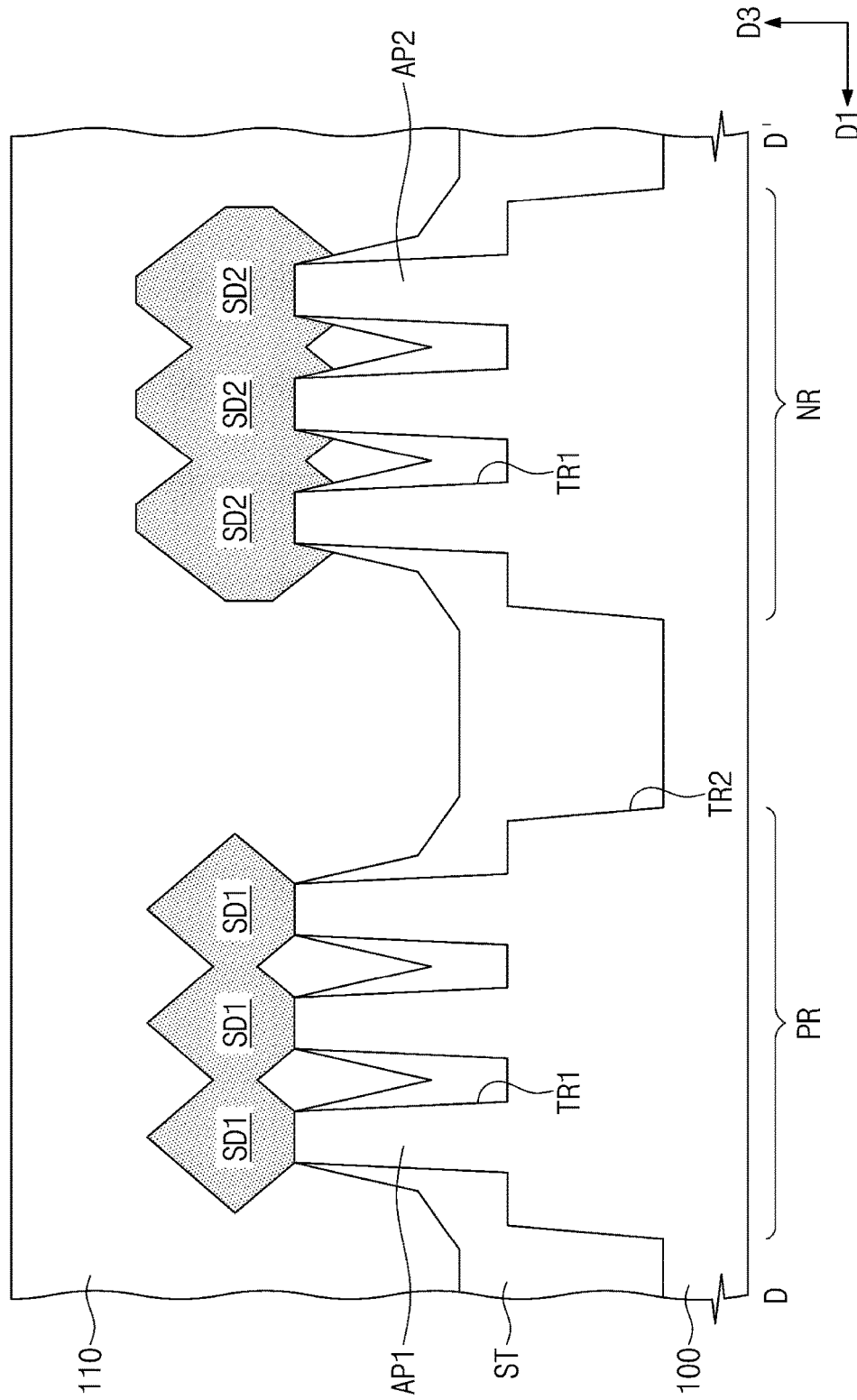
Figure 11:
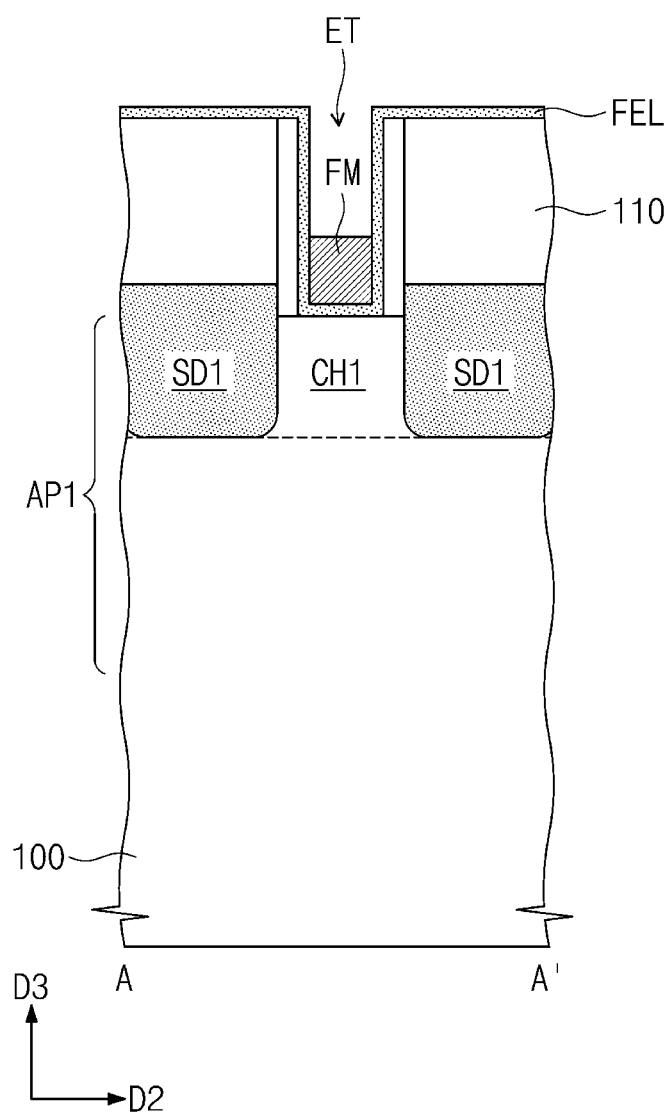
FIGS. 11 to 13 are sectional views, which are taken along a line A-A' of FIG. 9 and illustrate a method of forming a ferroelectric pattern and a gate electrode.
Figure 12:
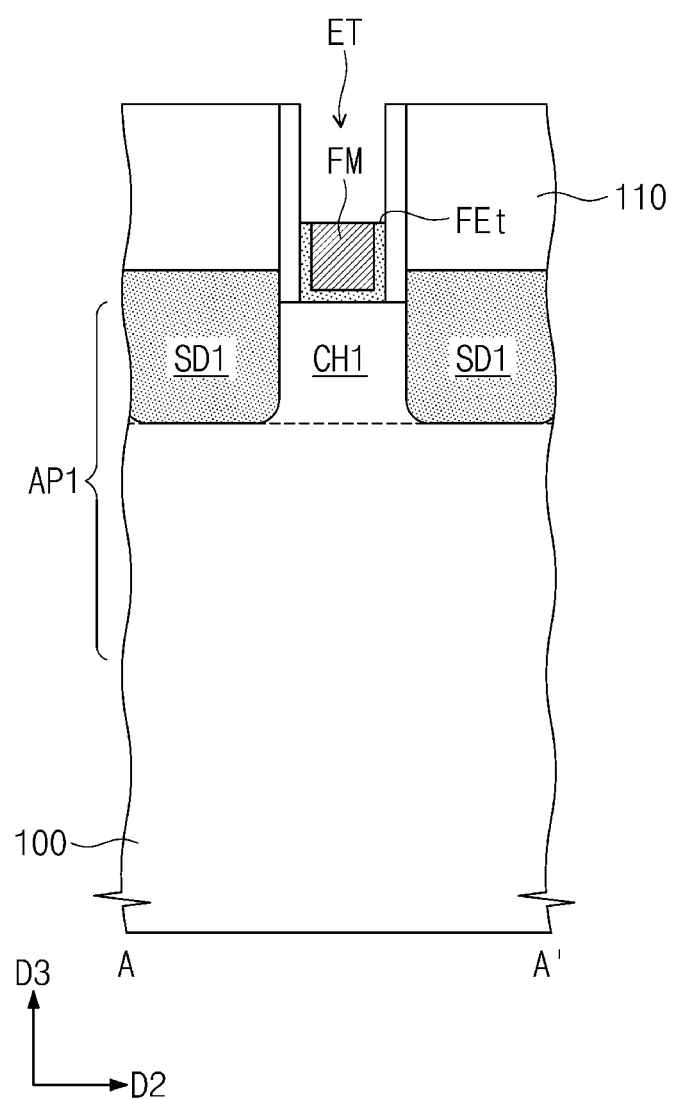
Figure 13:
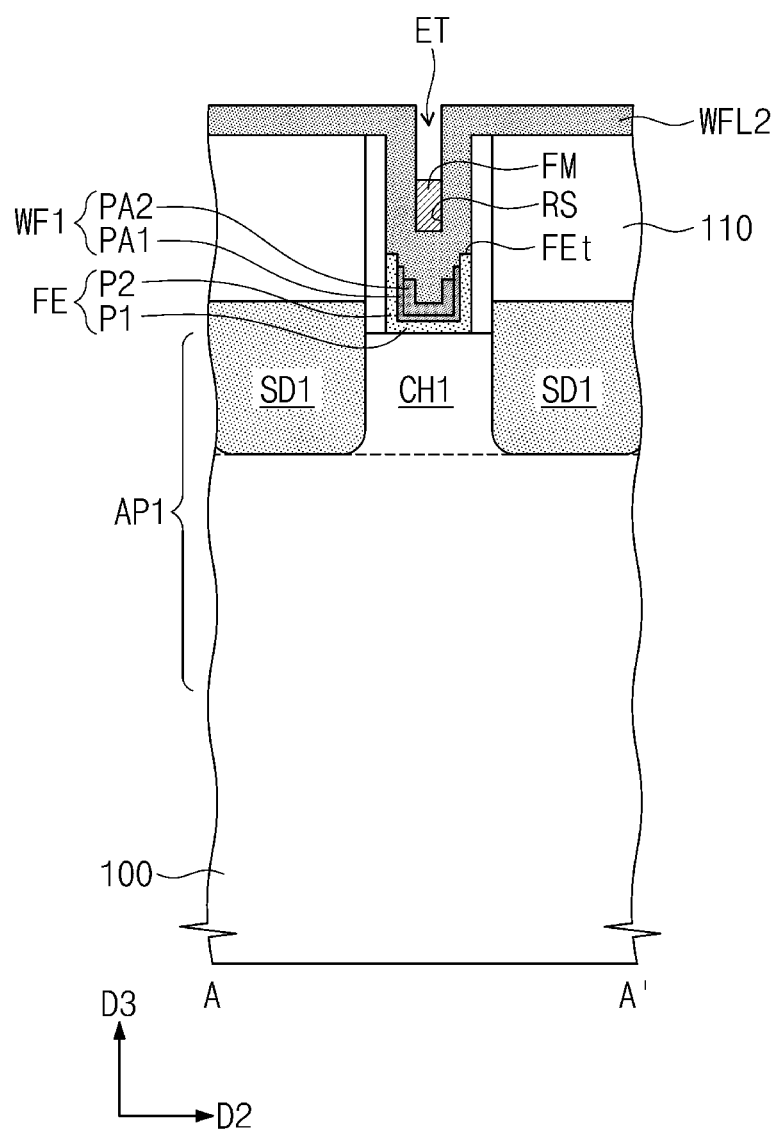

FIGS. 3, 5, 7, and 9 are plan views illustrating a method of fabricating a semiconductor device according to an embodiment of the inventive concept. FIGS. 4, 6A, 8A, and 10A are sectional views taken along lines A-A' of FIGS. 3, 5, 7, and 9, respectively. FIGS. 6B, 8B, and 10B are sectional views taken along lines B-B' of FIGS. 5, 7, and 9, respectively. FIGS. 6C, 8C, and 10C are sectional views taken along lines C-C' of FIGS. 5, 7, and 9, respectively. FIGS. 6D, 8D, and 10D are sectional views taken along lines D-D' of FIGS. 5, 7, and 9, respectively. FIGS. 11 to 13 are sectional views, which are taken along a line A-A' of FIG. 9 and illustrate a method of forming a ferroelectric pattern and a gate electrode.

Figure 3:
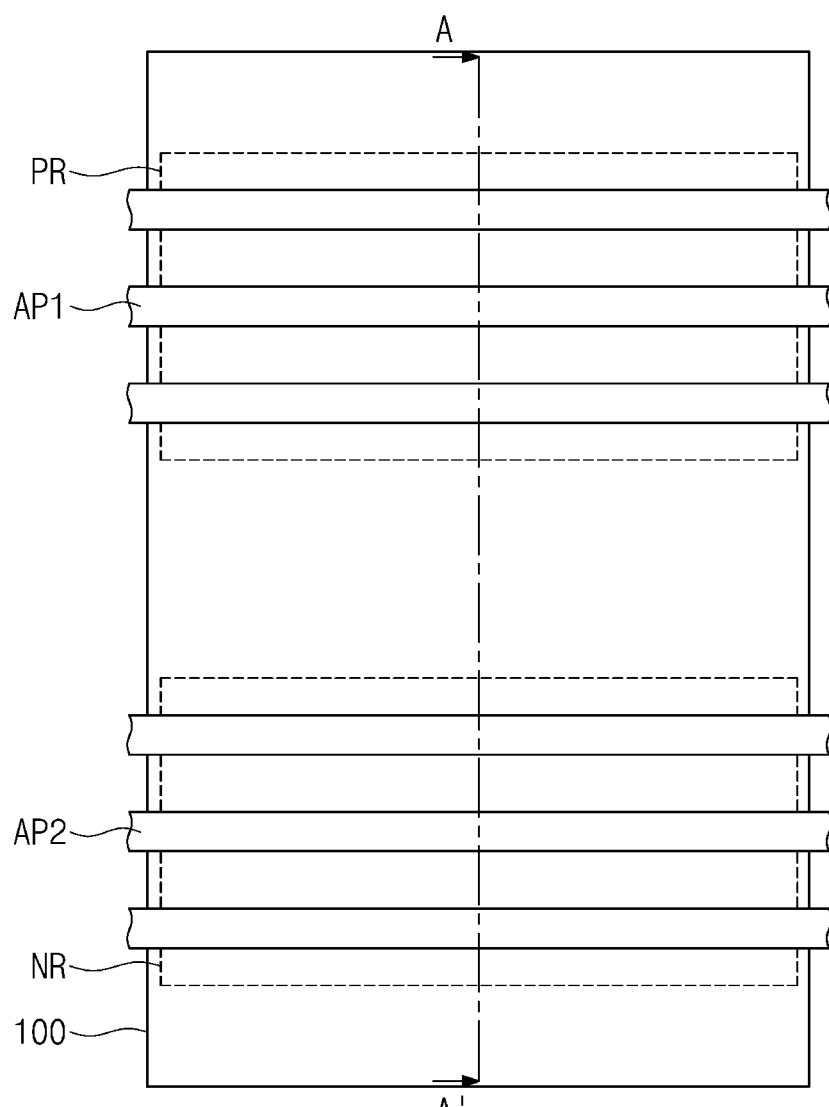
FIGS. 3, 5, 7, and 9 are plan views illustrating a method of fabricating a semiconductor device according to an embodiment of the inventive concept.
Figure 4:
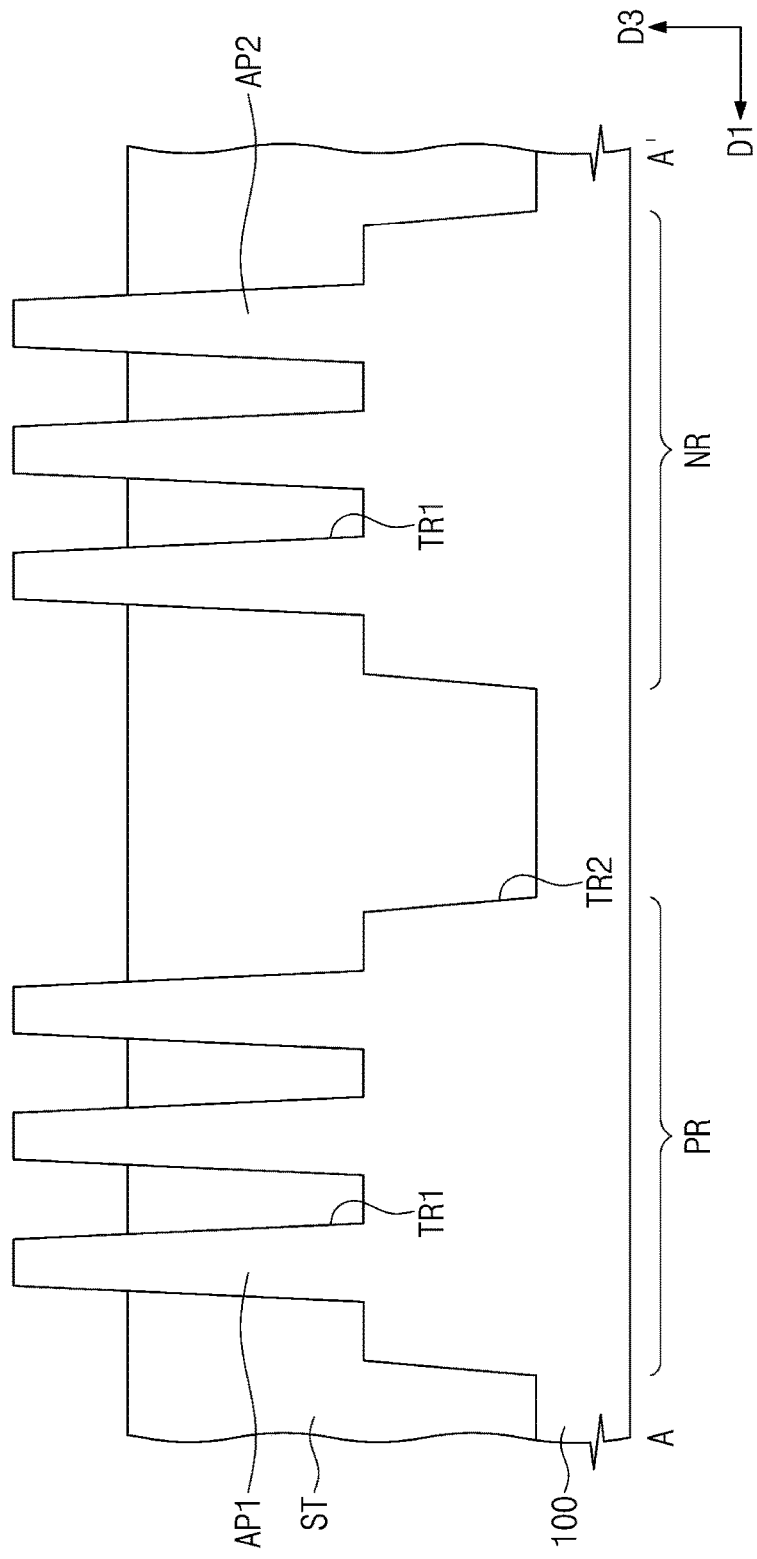
FIGS. 4, 6A, 8A, and 10A are sectional views taken along lines A-A' of FIGS. 3, 5, 7, and 9, respectively.
Figure 5:
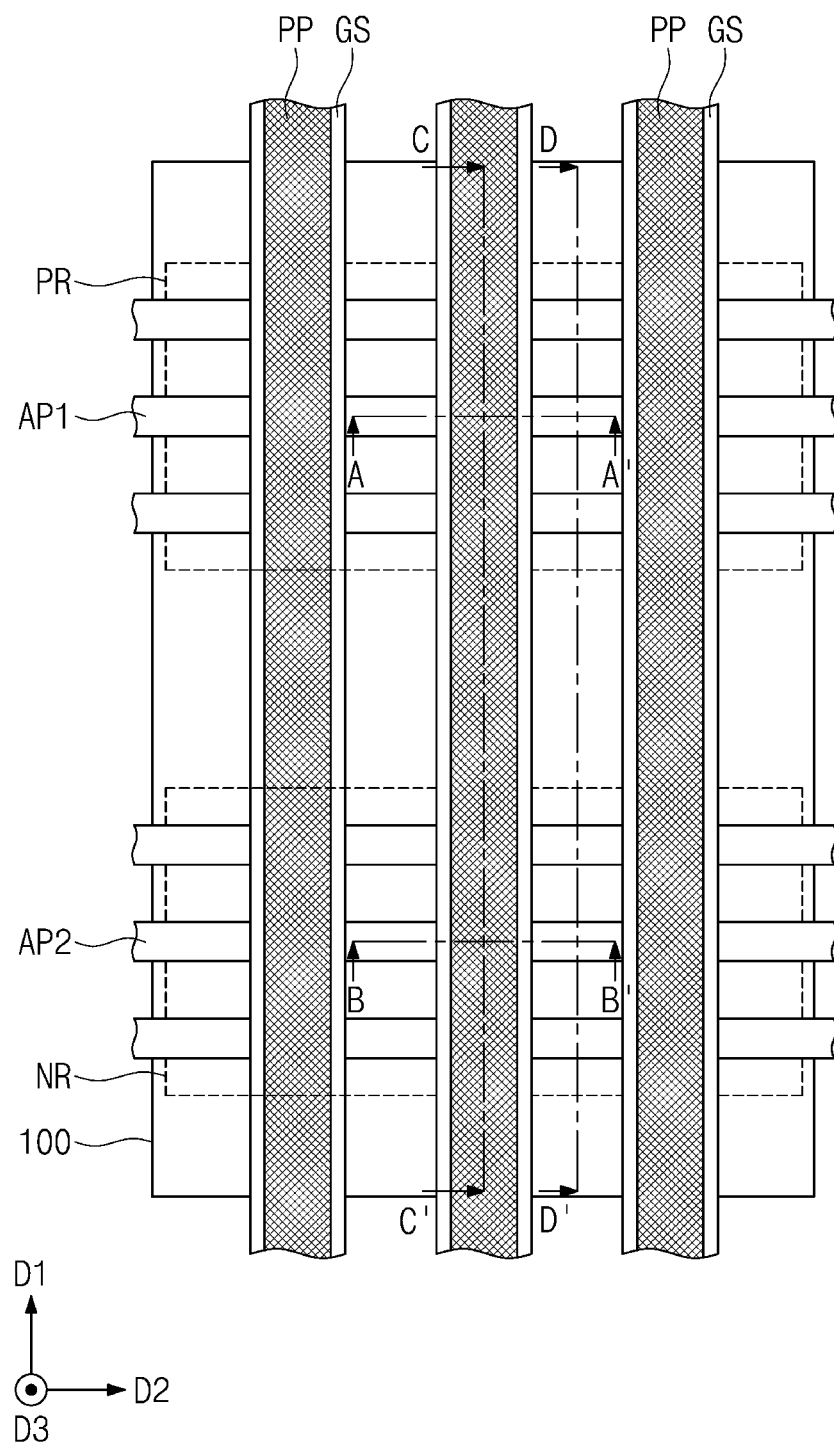

Referring to FIGS. 3 and 4, the substrate 100 including the PMOSFET region PR and the NMOSFET region NR may be provided. The first and second active patterns AP1 and AP2 may be formed by patterning the substrate 100. The first active patterns AP1 may be formed on the PMOSFET region PR, and the second active patterns AP2 may be formed on the NMOSFET region NR. The first trench TR1 may be formed between the first active patterns AP1 and between the second active patterns AP2.

The substrate 100 may be patterned to form the second trench TR2 between the PMOSFET region PR and the NMOSFET region NR. The second trench TR2 may be formed to be deeper than the first trench TR1, e.g., in the third direction D3.

The device isolation layer ST may be formed on the substrate 100 to fill the first and second trenches TR1 and TR2. For example, the device isolation layer ST may partially fill the first and second trenches TR1 and TR2. The device isolation layer ST may include an insulating material (e.g., a silicon oxide layer). The device isolation layer ST may be recessed to expose upper portions of the first and second active patterns AP1 and AP2. As a result, the upper portions of the first and second active patterns AP1 and AP2 may have a shape vertically protruding above the device isolation layer ST, e.g., in the third direction D3.

Referring to FIG. 5 and FIGS. 6A to 6D, sacrificial patterns PP may be formed to cross the first and second active patterns AP1 and AP2, e.g., in a plan view. The sacrificial patterns PP may be formed to have a line or bar shape extending in the first direction D1. For example, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may include a poly-silicon layer.

A pair of the gate spacers GS may be formed on opposite side surfaces of each of the sacrificial patterns PP. The gate spacers GS may also be formed on opposite side surfaces of each of the first and second active patterns AP1 and AP2. The opposite side surfaces of each of the first and second active patterns AP1 and AP2 may be surfaces that are not covered with the device isolation layer ST and sacrificial patterns PP and are exposed. For example, the gate spacers GS may be formed upper portions of the respective first and second active patterns AP1 and AP2.

The formation of the gate spacers GS may include conformally forming a gate spacer layer on the substrate 100 and anisotropically etching the gate spacer layer. The gate spacer layer may include at least one of SiCN, SiCON, or SiN. In an embodiment, the gate spacer layer may be a multi-layered structure including at least two of SiCN, SiCON, and SiN layers.

Referring to FIG. 7 and FIGS. 8A to 8D, the first source/drain patterns SD1 may be formed on or in upper portions of each of the first active patterns AP1. A pair of the first source/drain patterns SD1 may be formed at both sides of each of the sacrificial patterns PP.

For example, first recess regions may be formed by etching the upper portions of the first active patterns AP1 using the hard mask patterns MA and the gate spacers GS as an etch mask. The gate spacers GS on the opposite side surfaces of each of the first active patterns AP1 may be removed during the etching of the upper portions of the first active patterns AP1. The device isolation layer ST between the first active patterns AP1 may be recessed during the etching of the upper portions of the first active patterns AP1.

A selective epitaxial growth process, in which inner sidewalls of the first recess regions of the first active patterns AP1 are used as a seed layer, may be performed to form the first source/drain patterns SD1. As a result of the formation of the first source/drain patterns SD1, the first channel region CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may include a semiconductor material (e.g., SiGe) having a lattice constant greater than that of the semiconductor material included in the substrate 100. Each of the first source/drain patterns SD1 may be formed of a plurality of semiconductor layers.

As an example, during the selective epitaxial growth process, the first source/drain patterns SD1 may be doped in-situ with impurities. As another example, after the formation of the first source/drain patterns SD1, impurities may be injected into the first source/drain patterns SD1. The first source/drain patterns SD1 may be doped to have a first conductivity type (e.g., p-type).

The second source/drain patterns SD2 may be formed on or in the upper portions of each of the second active patterns AP2. A pair of the second source/drain patterns SD2 may be formed at both sides of each of the sacrificial patterns PP.

For example, second recess regions may be formed by etching the upper portions of the second active patterns AP2 using the hard mask patterns MA and the gate spacers GS as an etch mask. A selective epitaxial growth process, in which inner sidewalls of the second recess regions of the second active patterns AP2 are used as a seed layer, may be performed to form the second source/drain patterns SD2. As a result of the formation of the second source/drain patterns SD2, the second channel region CH2 may be defined between each pair of the second source/drain patterns SD2. In an embodiment, the second source/drain patterns SD2 may include the same semiconductor material (e.g., Si) as that of the substrate 100. The second source/drain patterns SD2 may be doped to have a second conductivity type (e.g., n-type).

The first source/drain patterns SD1 and the second source/drain patterns SD2 may be sequentially formed through different processes. For example, the first source/drain patterns SD1 and the second source/drain patterns SD2 may not be formed at the same time.

Referring to FIG. 9 and FIGS. 10A to 10D, the first interlayered insulating layer 110 may be formed to cover the first and second source/drain patterns SD1 and SD2, the hard mask patterns MA, and the gate spacers GS. As an example, the first interlayered insulating layer 110 may include a silicon oxide layer.

The first interlayered insulating layer 110 may be planarized to expose top surfaces of the sacrificial patterns PP. The planarization of the first interlayered insulating layer 110 may be performed using an etch-back or chemical mechanical polishing (CMP) process. During the planarization process, all of the hard mask patterns MA may be removed. As a result, the first interlayered insulating layer 110 may have a top surface that is substantially coplanar the top surfaces of the sacrificial patterns PP and the top surfaces of the gate spacers GS.

The sacrificial patterns PP may be replaced with the gate electrodes GE. For example, the exposed sacrificial patterns PP may be selectively removed. As a result of the removal of the sacrificial patterns PP, empty spaces may be formed in the places where the sacrificial patterns were disposed. The ferroelectric pattern FE, the gate electrode GE, and the gate capping pattern GP may be formed in each of the empty spaces.

Hereinafter, a method of forming the ferroelectric pattern FE and the gate electrode GE will be described in detail with reference to FIGS. 11 to 13. Referring to FIGS. 9 and 11, a ferroelectric layer FEL may be formed to partially fill an empty space ET, from which the sacrificial pattern PP is removed. The ferroelectric layer FEL may be formed using hafnium oxide which contains at least one of zirconium (Zr), silicon (Si), aluminum (Al), or lanthanum (La). For example, the hafnium oxide may be doped with at least one of zirconium (Zr), silicon (Si), aluminum (Al), or lanthanum (La). A filling material FM may be formed on the ferroelectric layer FEL to fill a lower portion of the empty space ET.

Referring to FIGS. 9 and 12, the ferroelectric layer FEL may be selectively etched using the filling material FM as a mask to form the ferroelectric pattern FE. For example, the ferroelectric pattern FE may be formed by chamfering the ferroelectric layer FEL. For example, the ferroelectric pattern FE may be formed by an etching process, e.g., by an etch-back process. The top surface FEt of the topmost portion of the ferroelectric pattern FE may be lower than the top surface of the gate spacer GS. The top surface FEt of the topmost portion of the ferroelectric pattern FE may be coplanar with the top surface of the filling material FM.

Referring to FIGS. 9 and 13, the filling material FM may be selectively removed. A first work function metal layer may be formed on the ferroelectric pattern FE, and the first work function metal pattern WF1 may be formed by chamfering the first work function metal layer. The chamfering of the first work function metal layer may be substantially the same as a process of chamfering the ferroelectric layer FEL, described with reference to FIG. 12.

A second work function metal layer WFL2 may be formed on the first work function metal pattern WF1 to partially fill the empty space ET. The second work function metal layer WFL2 may not fill the entirety of the empty space ET. Thus, the recess RS may be defined in the second work function metal layer WFL2. The filling material FM may be formed to fill the recess RS of the second work function metal layer WFL2. For example, the filling material FM may partially fill the recess RS of the second work function metal layer WFL2.

Referring back to FIGS. 9 and 10A, the second work function metal pattern WF2 may be formed by chamfering the second work function metal layer WFL2 using the filling material FM as a mask. Next, the filling material FM may be selectively removed. The barrier pattern BM and the electrode pattern EL may be sequentially formed to fill the recess RS of the second work function metal pattern WF2. For example, the topmost surface of the barrier pattern BM and the topmost surface of the electrode pattern EL may be at the same level as the topmost surface of the second work function metal pattern WF2. Next, a gate capping layer may be formed on the first interlayered insulating layer 110, the gate spacers GS, the second work function metal pattern WF2, the barrier pattern BM and the electrode pattern EL. The capping layer may be patterned to form the gate capping pattern GP. The gate capping layer may be patterned by a chemical mechanical polishing process. For example, the topmost surface of the gate capping pattern GP may be at the same level as the topmost surfaces of the gate spacers GS and the first interlayered insulating layer 110.

Referring back to FIG. 1 and FIGS. 2A to 2D, the second interlayered insulating layer 120 may be formed on the first interlayered insulating layer 110. The second interlayered insulating layer 120 may include a silicon oxide layer or a low-k oxide layer. As an example, the low-k oxide may include a carbon-doped silicon oxide layer, such as SiCOH. The second interlayered insulating layer 120 may be formed by a CVD process.

The active contacts AC may be formed to penetrate the second interlayered insulating layer 120 and the first interlayered insulating layer 110 and to be electrically connected to the first and second source/drain patterns SD1 and SD2. The gate contact GC may be formed on the second device isolation layer ST2 to penetrate the second interlayered insulating layer 120 and the gate capping pattern GP and to be electrically connected to the gate electrode GE.

Figure 14A:
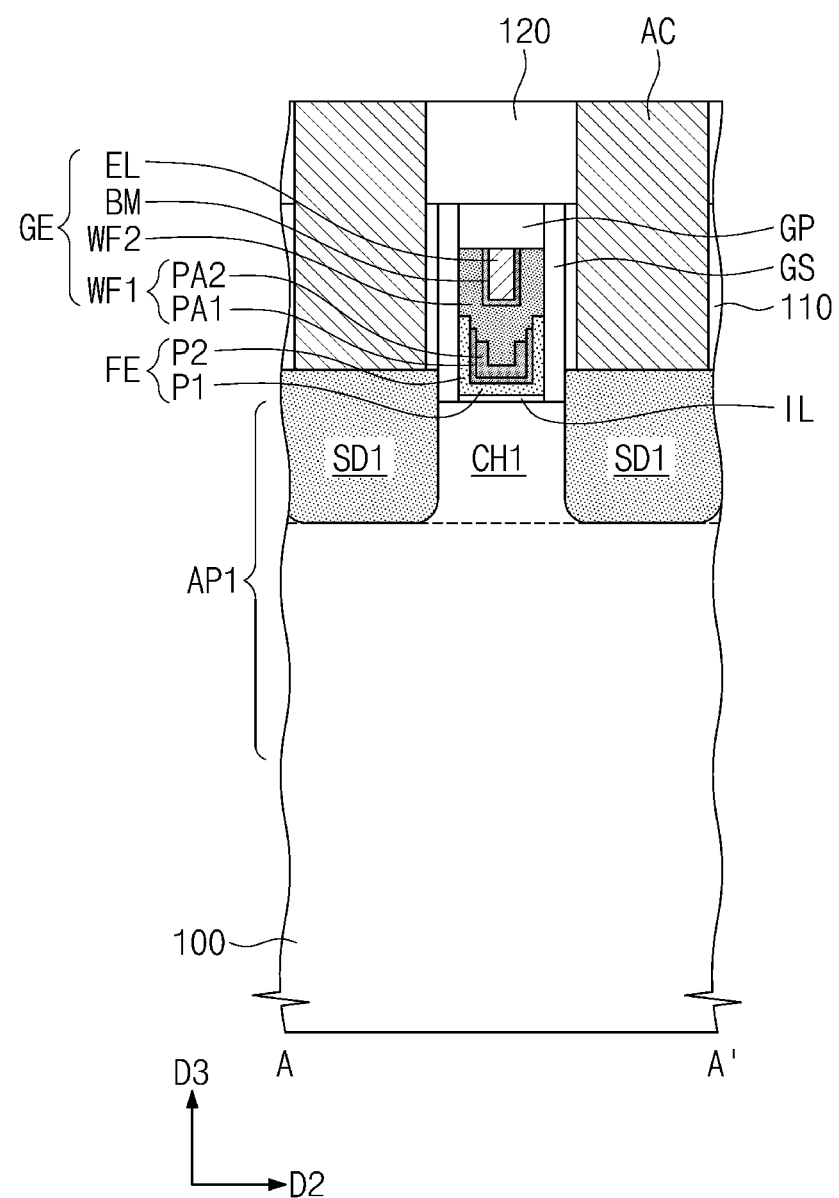
FIGS. 14A to 14C are sectional views, which are respectively taken along lines A-A', B-B', and C-C' of FIG. 1 and illustrate a semiconductor device according to an embodiment of the inventive concept.
Figure 14B:
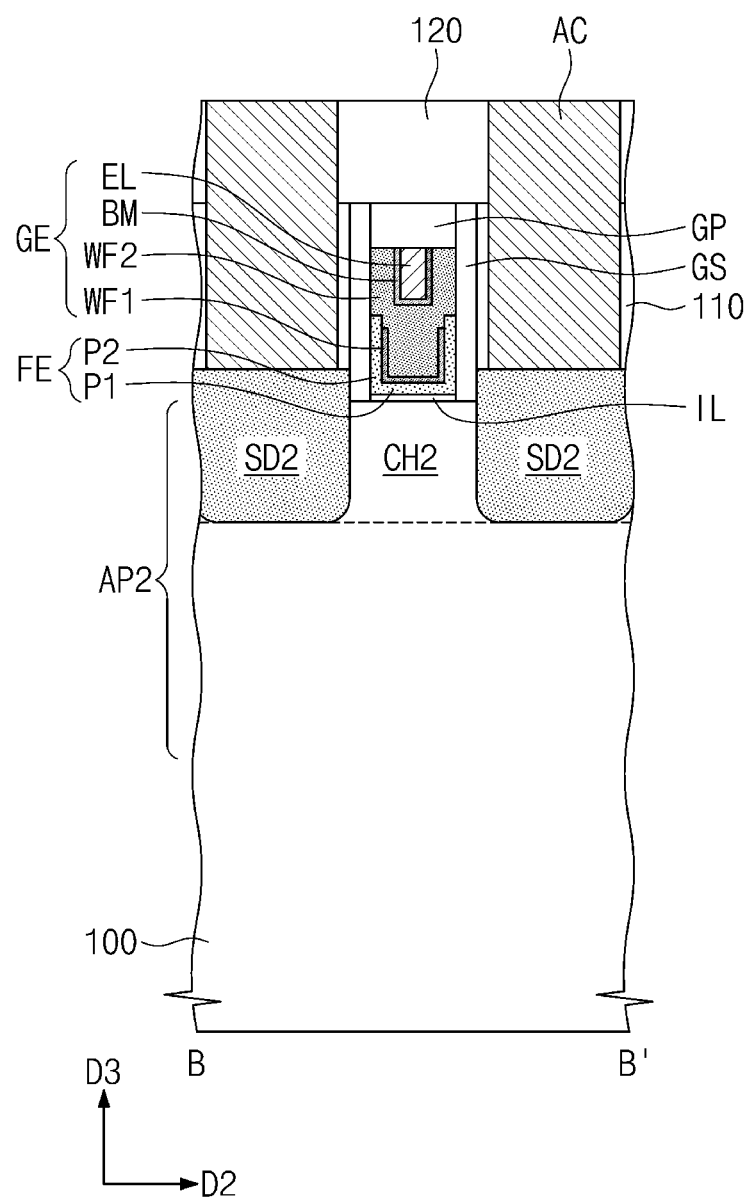
Figure 14C:
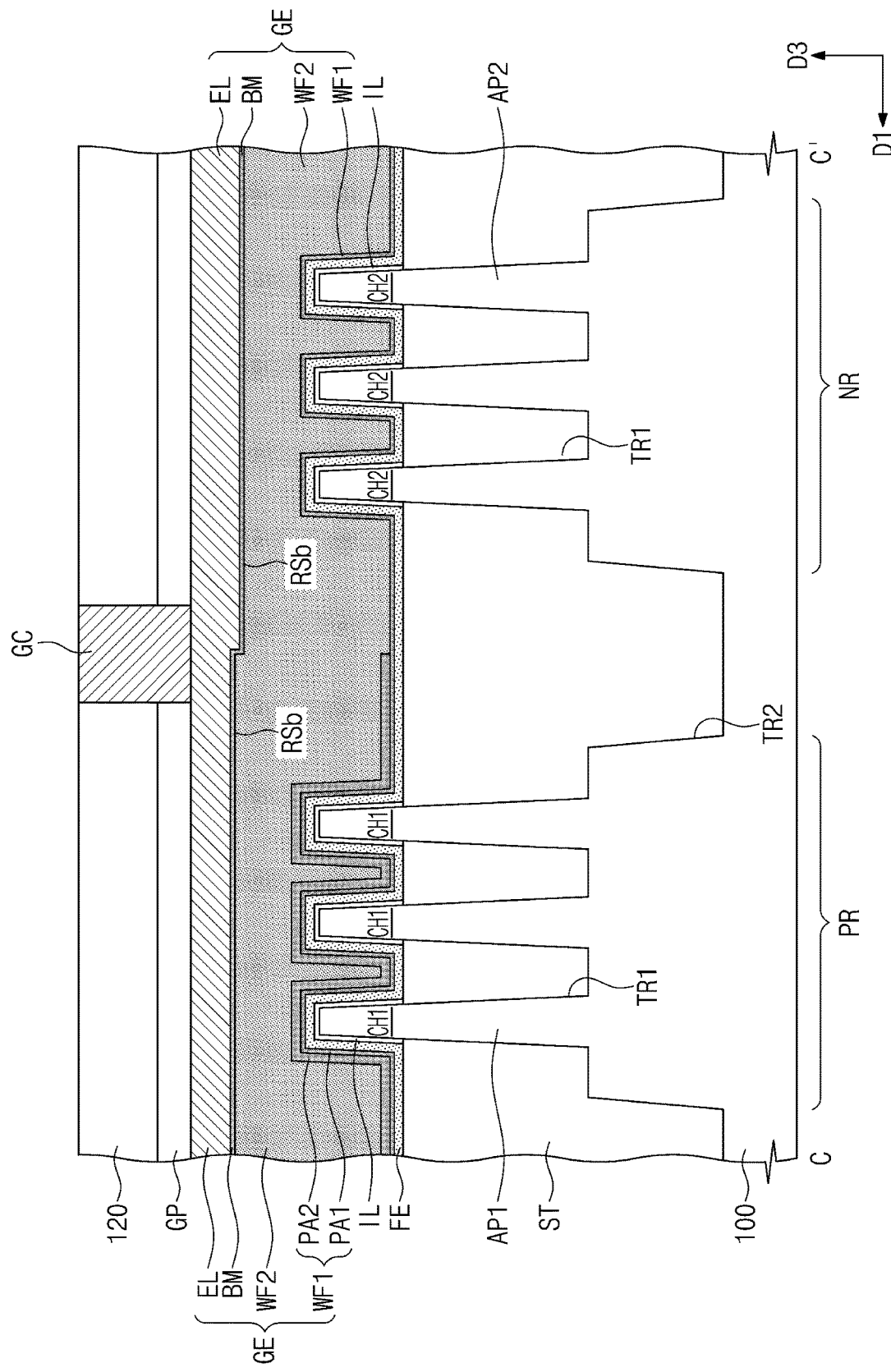

FIGS. 14A to 14C are sectional views, which are respectively taken along lines A-A', B-B', and C-C' of FIG. 1 and illustrate a semiconductor device according to an embodiment of the inventive concept. In the following description, an element previously described with reference to FIG. 1 and FIGS. 2A to 2D may be identified by the same reference number without repeating an overlapping description thereof.

Referring to FIG. 1 and FIGS. 14A to 14C, an interface layer IL may be interposed between the ferroelectric pattern FE and the first channel region CH1 and between the ferroelectric pattern FE and the second channel region CH2. The interface layer IL may cover the upper portion of the first active pattern AP1 vertically protruding above the device isolation layer ST. For example, the interface layer IL may directly cover a top surface and opposite side surfaces of the first channel region CH1. The interface layer IL may cover the upper portion of the second active pattern AP2 vertically protruding above the device isolation layer ST. For example, the interface layer IL may directly cover a top surface and opposite side surfaces of the second channel region CH2. As an example, the interface layer IL may include a silicon oxide layer.

Figure 15:
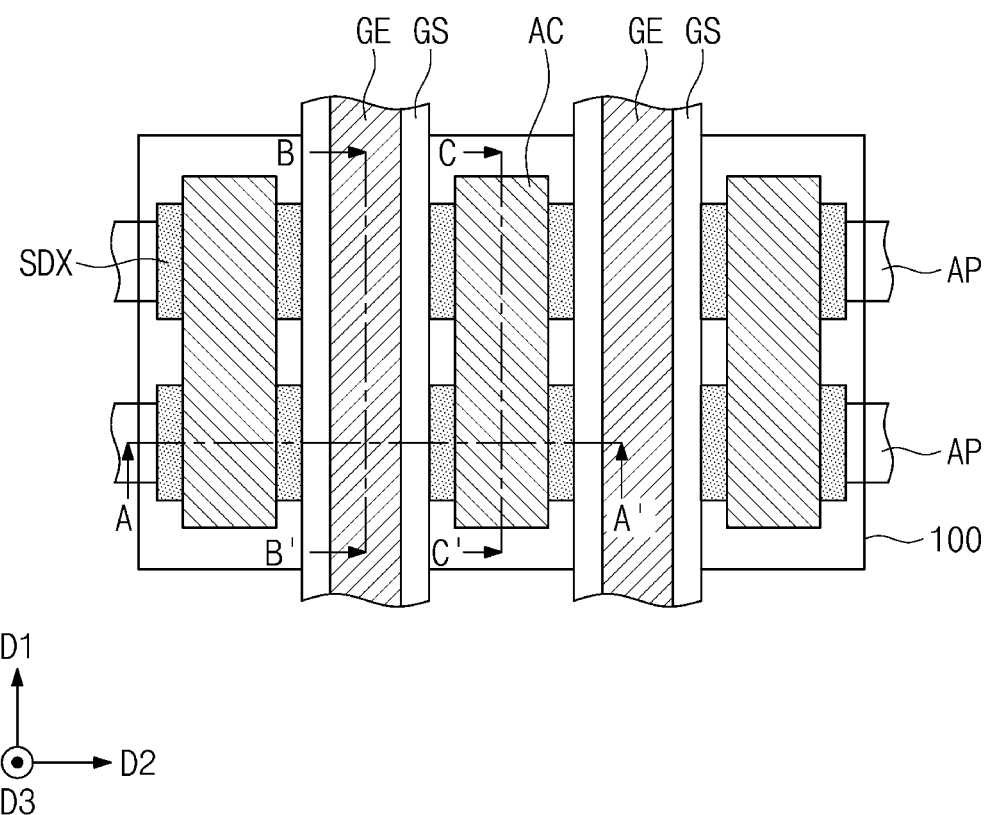
FIG. 15 is a plan view illustrating a semiconductor device according to an embodiment of the inventive concept.
Figure 16A:
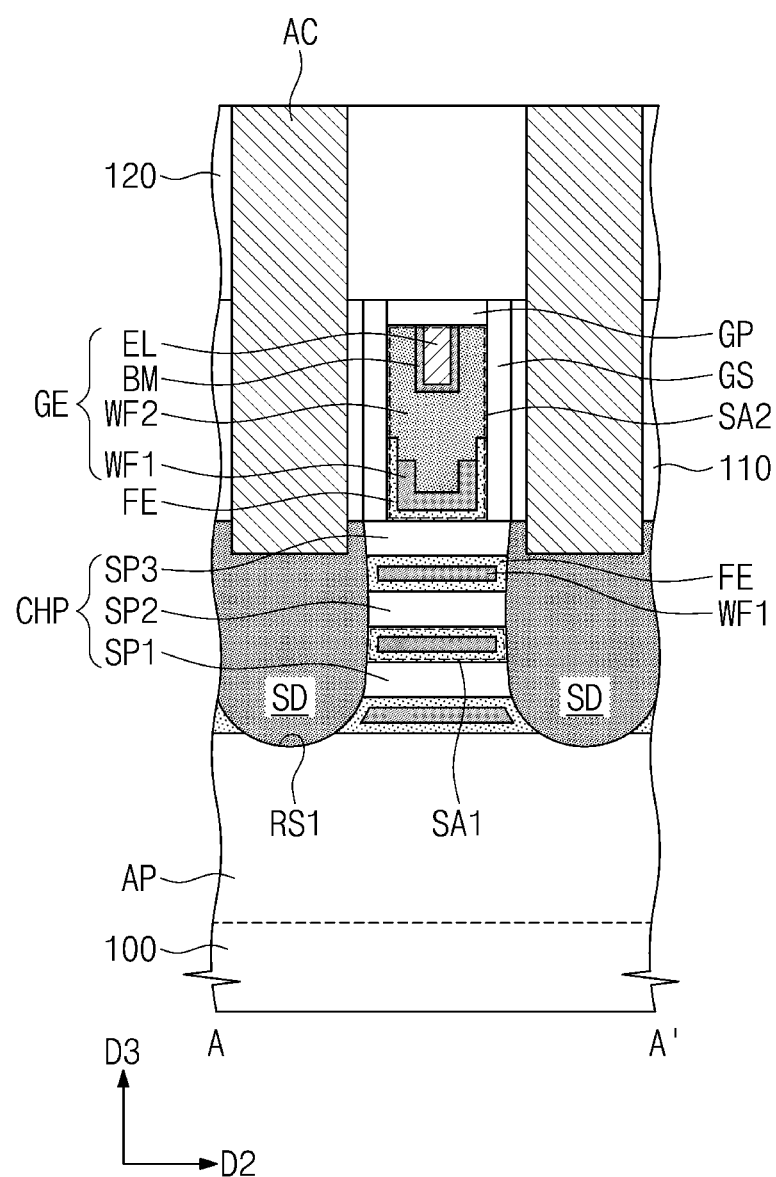
FIGS. 16A to 16C are sectional views respectively taken along lines A-A', B-B', and C-C' of FIG. 15.
Figure 16B:
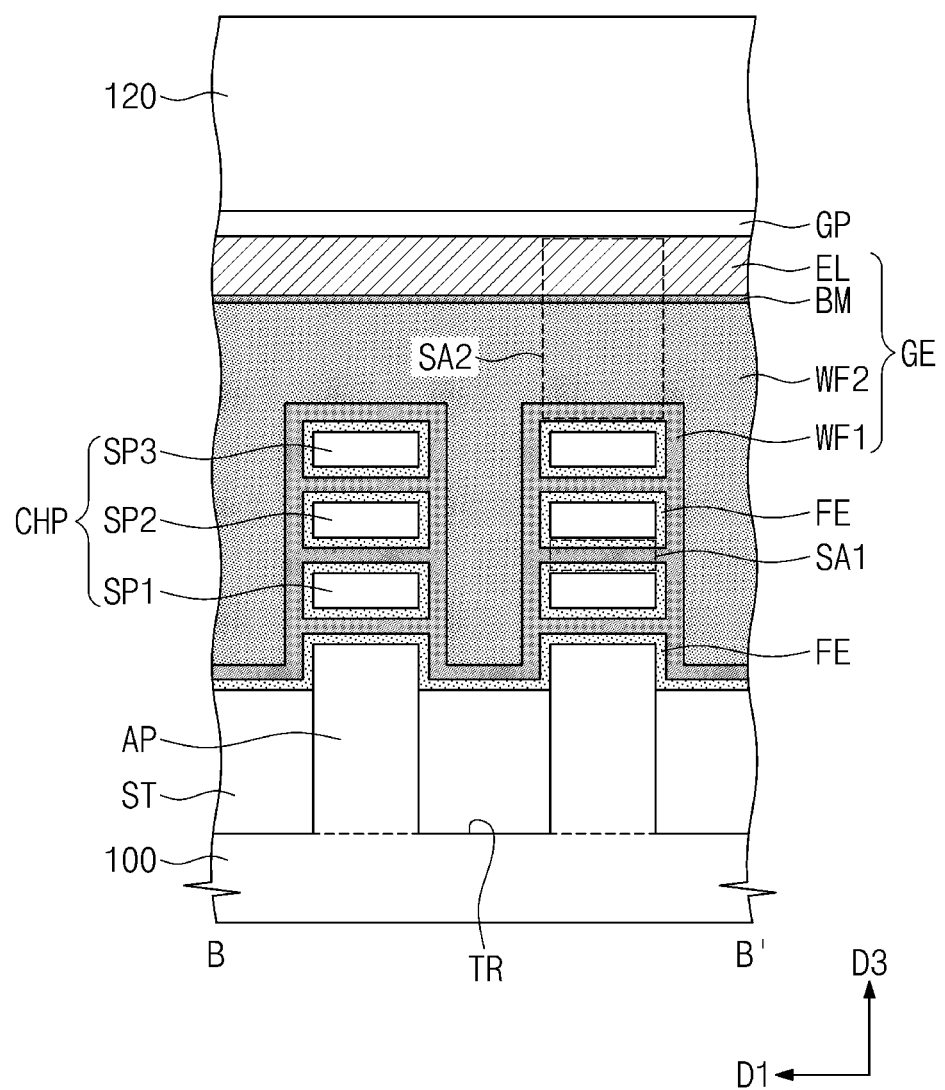
Figure 16C:
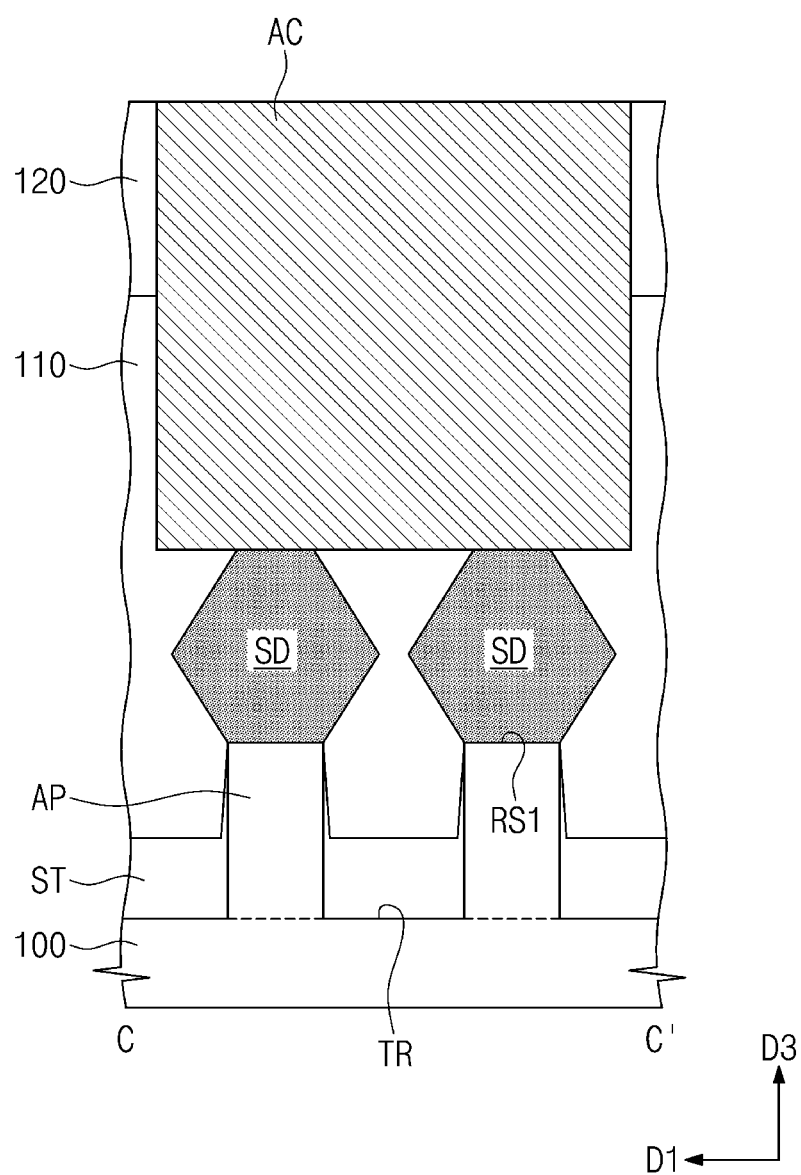

FIG. 15 is a plan view illustrating a semiconductor device according to an embodiment of the inventive concept. FIGS. 16A to 16C are sectional views respectively taken along lines A-A', B-B', and C-C' of FIG. 15. In the following description, an element previously described with reference to FIG. 1 and FIGS. 2A to 2D may be identified by the same reference number without repeating an overlapping description thereof.

Referring to FIG. 15 and FIGS. 16A to 16C, active patterns AP may be provided on a region of the substrate 100. As an example, the region of the substrate 100 may be a logic cell region. Logic transistors constituting a logic circuit may be disposed on the logic cell region.

The device isolation layer ST may be provided on the substrate 100. The device isolation layer ST may define the active patterns AP in an upper portion of the substrate 100. The active patterns AP may have a line or bar shape extending in the second direction D2.

The device isolation layer ST may fill a trench TR, which is formed between an adjacent pair of the active patterns AP. A top surface of the device isolation layer ST may be lower than top surfaces of the active patterns AP.

Source/drain patterns SD and a channel pattern CHP, which is interposed between an adjacent pair of the source/drain patterns SD, may be provided on the active pattern AP. The channel pattern CHP may include first to third semiconductor patterns SP1, SP2, and SP3, which are sequentially stacked. The first to third semiconductor patterns SP1, SP2, and SP3 may be spaced apart from each other in a third direction D3 which is perpendicular to the top surface of the substrate 100. The first to third semiconductor patterns SP1, SP2, and SP3 may be vertically overlapped with each other. Each of the source/drain patterns SD may be in direct contact with a side surface of each of the first to third semiconductor patterns SP1, SP2, and SP3. For example, the first to third semiconductor patterns SP1, SP2, and SP3 may electrically connect an adjacent pair of the source/drain patterns SD to each other.

The first to third semiconductor patterns SP1, SP2, and SP3 of the channel pattern CHP may have the same thickness or different thicknesses. As an example, when measured in the second direction D2, the largest lengths of the first to third semiconductor patterns SP1, SP2, and SP3 of the channel pattern CHP may be different from each other. As an example, the largest length of the first semiconductor pattern SP1 in the second direction D2 may be a first length. The largest length of the second semiconductor pattern SP2 in the second direction D2 may be a second length. The first length may be greater than the second length.

The first to third semiconductor patterns SP1, SP2, and SP3 of the channel pattern CHP may include at least one of silicon (Si), germanium (Ge), or silicon-germanium (SiGe). The channel pattern CHP is illustrated to have the first to third semiconductor patterns SP1, SP2, and SP3, but the inventive concept is not limited to a specific number of the semiconductor patterns. For example, the channel pattern CHP may have one or more layers of semiconductor patterns.

Each of the source/drain patterns SD may be an epitaxial pattern, which is formed by using the first to third semiconductor patterns SP1, SP2, and SP3 of the channel pattern CHP and the active pattern AP as a seed layer. As an example, a width of the source/drain pattern SD in the second direction D2 may be largest at its middle portion (e.g., see FIG. 16A). The width of the source/drain pattern SD in the second direction D2 may increase from its top portion toward the middle portion. The width of the source/drain pattern SD in the second direction D2 may be decreased from the middle portion toward its bottom portion. The source/drain patterns SD may be p-type impurity regions or n-type impurity regions. As an example, the source/drain patterns SD may be formed of or include SiGe or Si.

The gate electrodes GE may be provided to cross the channel pattern CHP and to extend in the first direction D1. The gate electrodes GE may be spaced apart from each other in the second direction D2. The gate electrode GE may be vertically overlapped with the channel pattern CHP. A pair of the gate spacers GS may be disposed on opposite side surfaces of the gate electrode GE. The gate capping pattern GP may be provided on the gate electrode GE.

Each of the gate electrodes GE may include the first work function metal pattern WF1, the second work function metal pattern WF2, the barrier pattern BM, and the electrode pattern EL, which are sequentially stacked. The first work function metal pattern WF1 may enclose each of the first to third semiconductor patterns SP1, SP2, and SP3 (e.g., see FIG. 16B). For example, the first work function metal pattern WF1 may be provided to face top, bottom, and opposite side surfaces of each of the first to third semiconductor patterns SP1, SP2, and SP3. For example, the transistors according to the present embodiment may be field effect transistors of a gate-all-around type.

The ferroelectric pattern FE may be provided between each of the first to third semiconductor patterns SP1, SP2, and SP3 and the first work function metal pattern WF1. The ferroelectric pattern FE may enclose each of the first to third semiconductor patterns SP1, SP2, and SP3. The ferroelectric pattern FE may be interposed between the upper portion of the active pattern AP and the first work function metal pattern WF1. The ferroelectric pattern FE may be interposed between the device isolation layer ST and the first work function metal pattern WF1.

The ferroelectric pattern FE, the first work function metal pattern WF1, the second work function metal pattern WF2, the barrier pattern BM and the electrode pattern EL may be substantially the same as those in the previous embodiment described with reference to FIG. 1 and FIGS. 2A to 2D.

A first space SA1 may be defined between the first semiconductor pattern SP1 and the second semiconductor pattern SP2 of the channel pattern CHP. For example, the first space SA1 may be defined between each pair of the semiconductor patterns SP1, SP2, and SP3, which are vertically adjacent to each other.

The ferroelectric pattern FE and the first work function metal pattern WF1 may fill the first space SA1. The ferroelectric pattern FE may be provided to conformally fill the first space SA1. The first work function metal pattern WF1 may fill a remaining region of the first space SA1, which is not filled with the ferroelectric pattern FE. The second work function metal pattern WF2, the barrier pattern BM, and the electrode pattern EL may not fill the first space SA1. The ferroelectric pattern FE in the first space SA1 may be in contact with the source/drain pattern SD (e.g., see FIG. 16A). For example, the ferroelectric pattern FE in the first space SA1 may be interposed between the gate electrode GE and the source/drain pattern SD.

A second space SA2 may be defined on the topmost semiconductor pattern (e.g., the third semiconductor pattern SP3) of the channel pattern CHP. The second space SA2 may be a space, which is enclosed by a pair of the gate spacers GS, the gate capping pattern GP, and the third semiconductor pattern SP3.

The ferroelectric pattern FE, the first work function metal pattern WF1, the second work function metal pattern WF2, the barrier pattern BM and the electrode pattern EL may fill the second space SA2. The structure or shapes of the ferroelectric pattern FE, the first work function metal pattern WF1, the second work function metal pattern WF2, the barrier pattern BM and the electrode pattern EL filling the second space SA2 may be similar to that of the previous embodiment described with reference to FIG. 1 and FIGS. 2A to 2D.

The first interlayered insulating layer 110 and the second interlayered insulating layer 120 may be provided on the substrate 100. The active contacts AC may be provided to penetrate the first and second interlayered insulating layers 110 and 120 and may be electrically connected to the source/drain patterns SD.

According to an embodiment of the inventive concept, a semiconductor device may include a transistor with improved sub-threshold swing characteristics and a reduced operation voltage.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
a substrate including an active pattern;
a gate electrode crossing the active pattern in a plan view; and
a ferroelectric pattern interposed between the active pattern and the gate electrode,
wherein the gate electrode comprises:
a work function metal pattern disposed on the ferroelectric pattern;
an electrode pattern filling a recess formed in an upper portion of the work function metal pattern; and
a barrier pattern interposed between the electrode pattern and the work function metal pattern, the barrier pattern filling at least a portion of the recess,
wherein a top surface of a topmost portion of the ferroelectric pattern is lower than a bottom surface of the recess.

2. The device of claim 1, further comprising a gate spacer disposed on a side surface of the gate electrode,
wherein the ferroelectric pattern comprises a first portion disposed on a top surface of the active pattern and a second portion vertically extending from the first portion along an inner sidewall of the gate spacer.

3. The device of claim 1, wherein the ferroelectric pattern comprises hafnium oxide doped with at least one of zirconium (Zr), silicon (Si), aluminum (Al), and lanthanum (La).

4. The device of claim 3, wherein the ferroelectric pattern comprises a portion having an orthorhombic crystal structure, and
a volume of the portion having the orthorhombic crystal structure ranges from 10% to 50% of a volume of the ferroelectric pattern.

5. The device of claim 1, wherein the work function metal pattern comprises a first work function metal pattern and a second work function metal pattern disposed on the first work function metal pattern,
wherein the first work function metal pattern comprises a metal nitride layer, and
wherein the second work function metal pattern comprises an aluminum-containing metal carbide or a silicon-containing metal carbide.

6. The device of claim 1, further comprising a trench formed in the substrate to define the active pattern and a device isolation layer filling the trench,
wherein an upper portion of the active pattern vertically protrudes above the device isolation layer, and
wherein the ferroelectric pattern is provided on a top surface and opposite side surfaces of the upper portion of the active pattern.

7. The device of claim 1, further comprising a pair of semiconductor patterns, the pair of semiconductor patterns stacked on the active pattern, and the pair of semiconductor patterns vertically spaced apart from each other, wherein the ferroelectric pattern and the work function metal pattern fill a space between the pair of the semiconductor patterns.

8. A semiconductor device, comprising:
a substrate including a first active pattern and a second active pattern;
a gate electrode crossing the first and second active patterns in a plan view; and
a ferroelectric pattern interposed between the first and second active patterns and the gate electrode,
wherein the gate electrode comprises:
a work function metal pattern disposed on the ferroelectric pattern;
a recess formed in an upper portion of the work function metal pattern; and
an electrode pattern formed in the recess,
wherein a height difference between a bottom surface of the recess and a top surface of a topmost portion of the ferroelectric pattern formed on the first active pattern is different from a height difference between a bottom surface of the recess and a top surface of a topmost portion of the ferroelectric pattern formed on the second active pattern.

9. The device of claim 8, further comprising a gate spacer disposed on a side surface of the gate electrode,
wherein the ferroelectric pattern comprises a first portion disposed on a top surface of the first active pattern and a second portion vertically extending from the first portion along an inner sidewall of the gate spacer.

10. The device of claim 8, wherein the ferroelectric pattern comprises hafnium oxide doped with at least one of zirconium (Zr), silicon (Si), aluminum (Al), and lanthanum (La).

11. The device of claim 10, wherein the ferroelectric pattern comprises a portion having an orthorhombic crystal structure, and
wherein a volume of the portion having the orthorhombic crystal structure ranges from 10% to 50% of a volume of the ferroelectric pattern.

12. The device of claim 8, wherein the gate electrode further comprises a barrier pattern interposed between the electrode pattern and the work function metal pattern, the barrier pattern formed in the recess.

13. The device of claim 8, further comprising a first source/drain pattern and a second source/drain pattern provided on the first active pattern and the second active pattern, respectively,
wherein the first and second source/drain patterns are disposed on side portions of the gate electrode in a plan view, and
wherein the first and second source/drain patterns have conductivity types different from each other.

14. The device of claim 8, wherein the work function metal pattern comprises a first work function metal pattern and a second work function metal pattern disposed on the first work function metal pattern, and
wherein a thickness of the first work function metal pattern disposed on the first active pattern is different from a thickness of the first work function metal pattern disposed on the second active pattern.

15. A semiconductor device, comprising:
a substrate including an active pattern;
a gate electrode crossing the active pattern in a plan view;
a gate spacer disposed on a side surface of the gate electrode; and
a ferroelectric pattern interposed between the active pattern and the gate electrode,
wherein the ferroelectric pattern comprises a first portion disposed on a top surface of the active pattern and a second portion extending from the first portion along an inner sidewall of the gate spacer,
wherein the gate electrode comprises a first work function metal pattern disposed on the ferroelectric pattern and a second work function metal pattern disposed on the first work function metal pattern, and
wherein the second work function metal pattern covers a top surface of the second portion of the ferroelectric pattern.

16. The device of claim 15, wherein the second work function metal pattern has a recess formed in an upper portion of the second work function metal pattern,
wherein the gate electrode further comprises an electrode pattern formed in the recess, and
wherein a top surface of the second portion of the ferroelectric pattern is lower than a bottom surface of the recess.

17. The device of claim 15, wherein the ferroelectric pattern comprises hafnium oxide doped with at least one of zirconium (Zr), silicon (Si), aluminum (Al), and lanthanum (La).

18. The device of claim 15, wherein the first work function metal pattern comprises a metal nitride layer, and
wherein the second work function metal pattern comprises an aluminum-containing metal carbide or silicon-containing metal carbide.

19. The device of claim 15, further comprising a trench formed in the substrate defining the active pattern and a device isolation layer formed in the trench,
wherein an upper portion of the active pattern vertically protrudes above the device isolation layer, and
wherein the ferroelectric pattern is provided on a top surface and opposite side surfaces of the upper portion of the active pattern.

* * * * *